United States Patent
Park et al.

(10) Patent No.: US 9,158,198 B2
(45) Date of Patent: Oct. 13, 2015

(54) PHOTORESIST COMPOSITIONS AND METHODS OF FORMING PHOTOLITHOGRAPHIC PATTERNS

(71) Applicant: Rohm and Haas Electronic Materials LLC, Marlborough, MA (US)

(72) Inventors: Jong Keun Park, Hudson, MA (US); Christopher Nam Lee, Concord, MA (US); Cecily Andes, Watertown, MA (US); Deyan Wang, Hudson, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 46 days.

(21) Appl. No.: 13/956,100

(22) Filed: Jul. 31, 2013

(65) Prior Publication Data

US 2014/0038102 A1 Feb. 6, 2014

Related U.S. Application Data

(60) Provisional application No. 61/678,094, filed on Jul. 31, 2012.

(51) Int. Cl.
| | |
|---|---|
| *G03F 7/004* | (2006.01) |
| *G03F 7/20* | (2006.01) |
| *G03F 7/038* | (2006.01) |
| *G03F 7/039* | (2006.01) |

(52) U.S. Cl.
CPC .............. *G03F 7/038* (2013.01); *G03F 7/004* (2013.01); *G03F 7/0392* (2013.01); *G03F 7/20* (2013.01); *G03F 7/2041* (2013.01)

(58) Field of Classification Search
CPC ....... G03F 7/004; G03F 7/039; G03F 7/0392; G03F 7/20; G03F 7/2041
USPC ...................................... 430/270.1, 326, 910
See application file for complete search history.

(56) References Cited

U.S. PATENT DOCUMENTS

| | | |
|---|---|---|
| 6,790,579 B1 | 9/2004 | Goodall et al. |
| 8,017,298 B2 | 9/2011 | Tsubaki |
| 8,722,825 B2 | 5/2014 | Wang et al. |
| 2001/0021744 A1* | 9/2001 | Araki et al. ..................... 524/544 |
| 2005/0186506 A1* | 8/2005 | Sasaki et al. ................ 430/270.1 |
| 2008/0096131 A1 | 4/2008 | Hatakeyama et al. |
| 2008/0187860 A1* | 8/2008 | Tsubaki et al. ............ 430/270.1 |
| 2009/0011365 A1* | 1/2009 | Kobayashi et al. ........ 430/284.1 |
| 2009/0286188 A1* | 11/2009 | Hatakeyama et al. ........ 430/323 |
| 2010/0297550 A1* | 11/2010 | Wang et al. ................ 430/270.1 |
| 2011/0294069 A1 | 12/2011 | Bae et al. |
| 2011/0318542 A1* | 12/2011 | Mori et al. .................. 428/195.1 |

FOREIGN PATENT DOCUMENTS

| | | | |
|---|---|---|---|
| JP | 2009-080482 | * | 4/2009 |
| WO | WO 2010/073934 | * | 7/2010 |

OTHER PUBLICATIONS

Machine translation of JP 2009-080482, published on Apr. 16, 2009.*
Taiwan search report of corresponding Taiwan Application No. 102127387 mailed Sep. 2, 2014.

* cited by examiner

*Primary Examiner* — Anca Eoff
(74) *Attorney, Agent, or Firm* — Jonathan D. Baskin

(57) ABSTRACT

Provided are photoresist compositions useful in forming photolithographic patterns by a negative tone development process. Also provided are methods of forming photolithographic patterns by a negative tone development process and substrates coated with the photoresist compositions. The photoresist compositions include one or more polymer additive that contains a basic moiety and which is substantially non-miscible with a resin component of the resist. The compositions, methods and coated substrates find particular applicability in the manufacture of semiconductor devices.

18 Claims, 1 Drawing Sheet

PHOTORESIST COMPOSITIONS AND METHODS OF FORMING PHOTOLITHOGRAPHIC PATTERNS

This application claims the benefit of priority under 35 U.S.C. §119(e) of U.S. Provisional Application No. 61/678,094, filed Jul. 31, 2012, the entire contents of which are incorporated herein by reference.

FIELD

The invention relates generally to the manufacture of electronic devices. More specifically, this invention relates to photoresist compositions and to photolithographic processes which allow for the formation of fine patterns using a negative tone development process.

BACKGROUND

Considerable effort has been made to extend the practical resolution capabilities of positive tone development in immersion lithography from both materials and processing standpoints. One such example involves negative tone development (NTD), an image reversal technique allowing for use of the superior imaging quality obtained with bright field masks to print the critical dark field layers. NTD resists typically employ a resin having acid-labile groups and a photoacid generator. Exposure to actinic radiation causes the photoacid generator to form an acid which, during post-exposure baking, causes cleavage of the acid-labile groups in the resin. As a result, a difference in solubility characteristics in organic developers is created between exposed and unexposed regions of the resist such that unexposed regions of the resist are removed by the developer, leaving behind a pattern created by the insoluble exposed regions. Such a process is described, for example, in U.S. Pat. No. 6,790,579, to Goodall et al. For the resist chemistries described, the exposed areas of the resist layer can be selectively removed with an alkaline developer or, alternatively, the unexposed regions can be selectively removed by treatment with a suitable non-polar solvent for negative tone development.

The inventors have observed that surface inhibition of the photoresist in NTD processes can result in "necking" of contact holes or "T-topping" in line and trench patterns in the developed resist patterns. This effect is illustrated in FIG. 1, showing a substrate 1, a layer to be patterned 2 and a patterned photoresist layer 3. During photoresist exposure, the polarity-switched region undesirably extends into regions 4 at the resist surface which lay beneath the edge portions of the opaque photomask pattern. This is believed to be a result of diffusion of stray light beneath edges of opaque mask pattern. During development with an organic developer, unexposed (unswitched) regions of the photoresist layer are removed to form contact hole pattern 5. The resulting pattern exhibits necking at the resist layer upper surface where the polarity-switched resist regions 4 are not removed. The occurrence of necking and T-topping generally results in a poor process window including depth of focus and exposure latitude. These problems can lead, for example, to random missing contact holes or to micro-bridging defects in the case of narrow trench or line pattern formation, thereby adversely impacting device yield.

U.S. Patent Application Pub. No. US2011/0294069A1, to Bae et al, discloses photoresist compositions that include a matrix polymer that is acid sensitive, a particular additive polymer that has a surface energy lower than a surface energy of the first polymer; a photoacid generator and a solvent. While that document recognizes problems associated with surface inhibition, further improved solutions to this problem are needed.

There is a continuing need in the art for improved compositions and photolithographic methods for negative tone development which allow for the formation of fine patterns in electronic device fabrication and which address one or more problems associated with the state of the art.

SUMMARY

According to a first aspect of the invention, photoresist compositions are provided. The photoresist compositions comprise: a photoresist composition, comprising: a first polymer comprising an acid labile group; a second polymer comprising: a first unit formed from a first monomer having the following general formula (I):

(I)

wherein: P is a polymerizable functional group, $R_1$ is chosen from substituted and unsubstituted C1 to C20 linear, branched and cyclic hydrocarbons, Z is a spacer unit chosen from substituted and unsubstituted linear or branched aliphatic and aromatic hydrocarbons, and combinations thereof, optionally with one or more linking moiety chosen from —O—, —S— and —COO—, and n is an integer from 0 to 5, and a second unit formed from a second monomer having a basic moiety, wherein the first monomer and the second monomer are different, wherein the second polymer is free of acid-labile groups and wherein the second polymer has a surface energy lower than a surface energy of the first polymer; a photoacid generator; and a solvent.

According to a further aspect, coated substrates are provided. The coated substrates comprise a substrate and a layer of a photoresist composition of the invention over a surface of the substrate.

According to a further aspect, methods of forming a photolithographic pattern are provided. The methods comprise: (a) providing a substrate comprising one or more layer to be patterned over a surface of the substrate; (b) applying a layer of a photoresist composition of the invention over the one or more layer to be patterned; (c) patternwise exposing the photoresist composition layer to actinic radiation; (d) heating the exposed photoresist composition layer in a post-exposure bake process; and (e) applying a developer to the photoresist composition layer, wherein unexposed portions of the photoresist layer are removed by the developer, leaving a photoresist pattern over the one or more layer to be patterned. The patternwise exposing can be conducted by immersion lithography or, alternatively, using dry exposure techniques.

In accordance with a further aspect, electronic devices formed by the described negative tone development processes are provided.

As used herein, the articles "a" and "an" are inclusive of one or more unless otherwise indicated expressly or by context.

BRIEF DESCRIPTION OF THE DRAWINGS

The present invention will be discussed with reference to the following drawings, in which like reference numerals denote like features, and in which.

DETAILED DESCRIPTION

Figure 1:
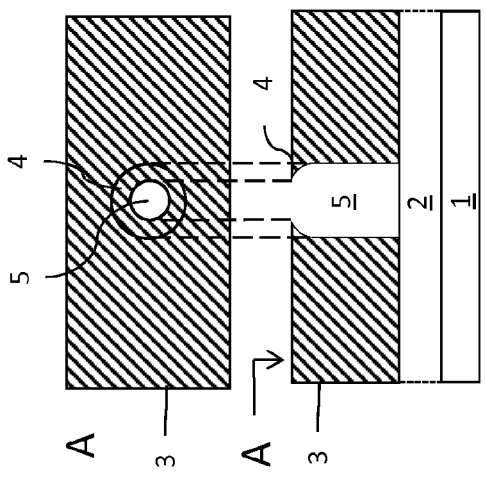
FIG. 1 illustrates a contact hole photoresist pattern according to the related art.

The photoresist compositions of the invention are particularly suitable for use in negative tone development processes. Particularly preferred photoresist compositions of the invention when used in a negative tone development process provide one or preferably more of improved focus latitude and exposure latitude, resist patterns such as lines and contact holes which are uniform in geometry, and reduced defectivity. The additive polymer migrates toward the upper surface of the resist coating layer during coating of the photoresist composition, thereby forming a surface layer substantially made up of the additive polymer. The basic moiety of the additive polymer is believed to contribute to the control of scattered or stray light, thereby allowing for reduction in patterning defects such as missing contact holes and micro-bridging defects in the case of line and trench pattern formation. Following exposure and post exposure bake (PEB), the resist coating layer is developed in a developer comprising an organic solvent. The developer removes unexposed regions of the photoresist layer and the surface layer of the exposed regions. Benefits of the inventive photoresist compositions can be achieved when using the compositions in dry lithography or immersion lithography processes. When used in immersion lithography, preferred photoresist compositions can further exhibit reduced migration (leaching) of photoresist materials into an immersion fluid also a result of the additive polymer's migration to the resist surface. Significantly, this can be achieved without use of a topcoat layer over the photoresist.

The photoresists can be used at a variety of radiation wavelengths, for example, wavelengths of sub-400 nm, sub-300 or sub-200 nm, or with 248 nm, 193 nm and EUV (e.g., 13.5 nm) exposure wavelengths being preferred. The compositions can further be used in electron beam (E-beam) exposure processes.

The photoresist compositions of the invention are chemically-amplified materials. The compositions include one or more matrix polymer comprising an acid labile group. The acid labile group is a chemical moiety that readily undergoes deprotection reaction in the presence of an acid. The matrix polymer as part of a layer of the photoresist composition undergoes a change in solubility in a developer described herein as a result of reaction with acid generated from the photoacid generator following softbake, exposure to activating radiation and post exposure bake. This results from photoacid-induced cleavage of the acid labile group, causing a change in polarity of the matrix polymer. The acid labile group can be chosen, for example, from tertiary alkyl carbonates, tertiary alkyl esters, tertiary alkyl ethers, acetals and ketals. Preferably, the acid labile group is an ester group that contains a tertiary non-cyclic alkyl carbon or a tertiary alicyclic carbon covalently linked to a carboxyl oxygen of an ester of the matrix polymer. The cleavage of such acid labile groups results in the formation of carboxylic acid groups. Suitable acid labile-group containing units include, for example, acid-labile (alkyl)acrylate units, such as t-butyl(meth)acrylate, 1-methylcyclopentyl(meth)acrylate, 1-ethylcyclopentyl (meth)acrylate, 1-isopropylcyclopentyl(meth)acrylate, 1-propylcyclopentyl(meth)acrylate, 1-methylcyclohexyl (meth)acrylate, 1-ethylcyclohexyl(meth)acrylate, 1-isopropylcyclohexyl(meth)acrylate, 1-propylcyclohexyl(meth) acrylate, t-butyl methyladamantyl(meth)acrylate, ethylfenchyl(meth)acrylate, and the like, and other cyclic, including alicyclic, and non-cyclic (alkyl)acrylates. Acetal and ketal acid labile groups can be substituted for the hydrogen atom at the terminal of an alkali-soluble group such as a carboxyl group or hydroxyl group, so as to be bonded with an oxygen atom. When acid is generated, the acid cleaves the bond between the acetal or ketal group and the oxygen atom to which the acetal-type acid-dissociable, dissolution-inhibiting group is bonded. Exemplary such acid labile groups are described, for example, in U.S. Pat. No. 6,057,083, U.S. Pat. No. 6,136,501 and U.S. Pat. No. 8,206,886 and European Pat. Pub. Nos. EP01008913A1 and EP00930542A1. Also suitable are acetal and ketal groups as part of sugar derivative structures, the cleavage of which would result in the formation of hydroxyl groups, for example, those described in U.S. Patent Application No. US2012/0064456A1.

For wavelengths of 200 nm or greater such as 248 nm, suitable resin materials include, for example, phenolic resins that contain acid-labile groups. Particularly preferred resins of this class include: (i) polymers that contain polymerized units of a vinyl phenol and an acid labile (alkyl)acrylate as described above, such as polymers described in U.S. Pat. Nos. 6,042,997 and 5,492,793; (ii) polymers that contain polymerized units of a vinyl phenol, an optionally substituted vinyl phenyl (e.g., styrene) that does not contain a hydroxy or carboxy ring substituent, and an acid labile (alkyl)acrylate such as described above, such as polymers described in U.S. Pat. No. 6,042,997; (iii) polymers that contain repeat units that comprise an acetal or ketal moiety that will react with photoacid, and optionally aromatic repeat units such as phenyl or phenolic groups; such polymers described in U.S. Pat. Nos. 5,929,176 and 6,090,526, and blends of (i) and/or (ii) and/or (iii).

For imaging at certain sub-200 nm wavelengths such as 193 nm, the matrix polymer is typically substantially free (e.g., less than 15 mole %), preferably completely free, of phenyl, benzyl or other aromatic groups where such groups are highly absorbing of the radiation. Suitable polymers that are substantially or completely free of aromatic groups are disclosed in European Patent Publication No. EP930542A1 and U.S. Pat. Nos. 6,692,888 and 6,680,159.

Other suitable matrix polymers include, for example, those which contain polymerized units of a non-aromatic cyclic olefin (endocyclic double bond) such as an optionally substituted norbornene, for example, polymers described in U.S. Pat. Nos. 5,843,624 and 6,048,664. Still other suitable matrix polymers include polymers that contain polymerized anhydride units, particularly polymerized maleic anhydride and/or itaconic anhydride units, such as disclosed in European Published Application EP01008913A1 and U.S. Pat. No. 6,048,662.

Also suitable as the matrix polymer is a resin that contains repeat units that contain a hetero atom, particularly oxygen and/or sulfur (but other than an anhydride, i.e., the unit does not contain a keto ring atom). The heteroalicyclic unit can be fused to the polymer backbone, and can comprise a fused carbon alicyclic unit such as provided by polymerization of a norbornene group and/or an anhydride unit such as provided by polymerization of a maleic anhydride or itaconic anhydride. Such polymers are disclosed in International Pub. No. WO0186353A1 and U.S. Pat. No. 6,306,554. Other suitable hetero-atom group containing matrix polymers include polymers that contain polymerized carbocyclic aryl units substituted with one or more hetero-atom (e.g., oxygen or sulfur) containing groups, for example, hydroxy naphthyl groups, such as disclosed in U.S. Pat. No. 7,244,542.

In the case of sub-200 nm wavelengths such as 193 nm and EUV (e.g., 13.5 nm), the matrix polymer typically further includes a unit containing a lactone moiety for controlling the dissolution rate of the matrix polymer and photoresist composition. Suitable monomers for use in the matrix polymer containing a lactone moiety include, for example, the following:

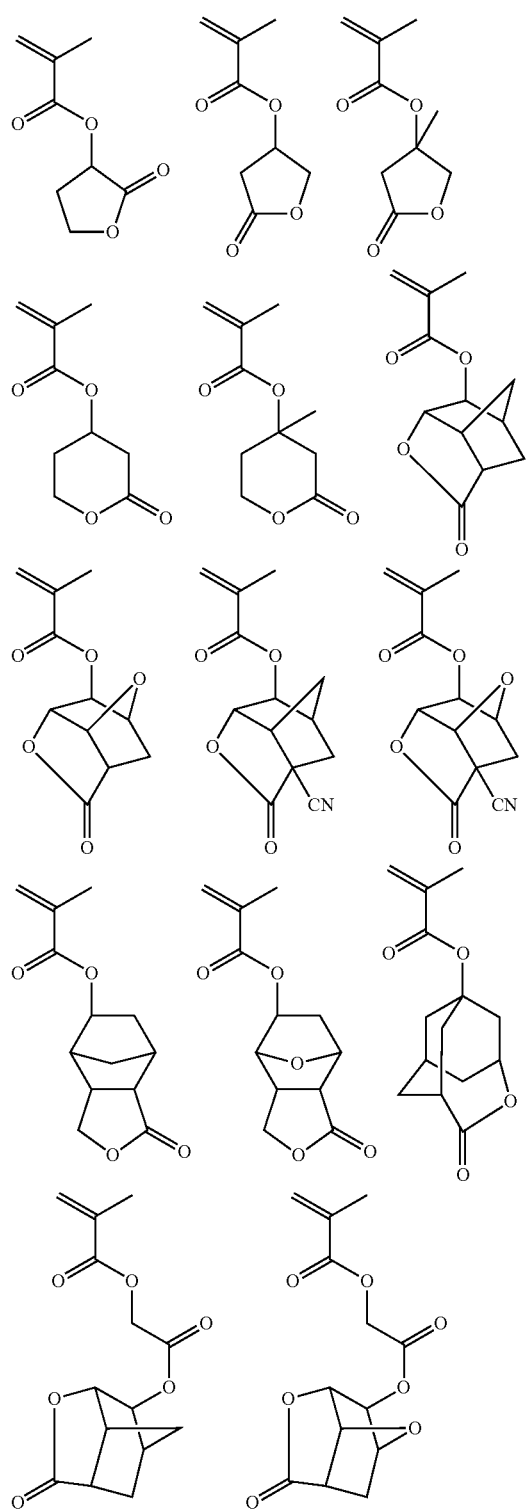

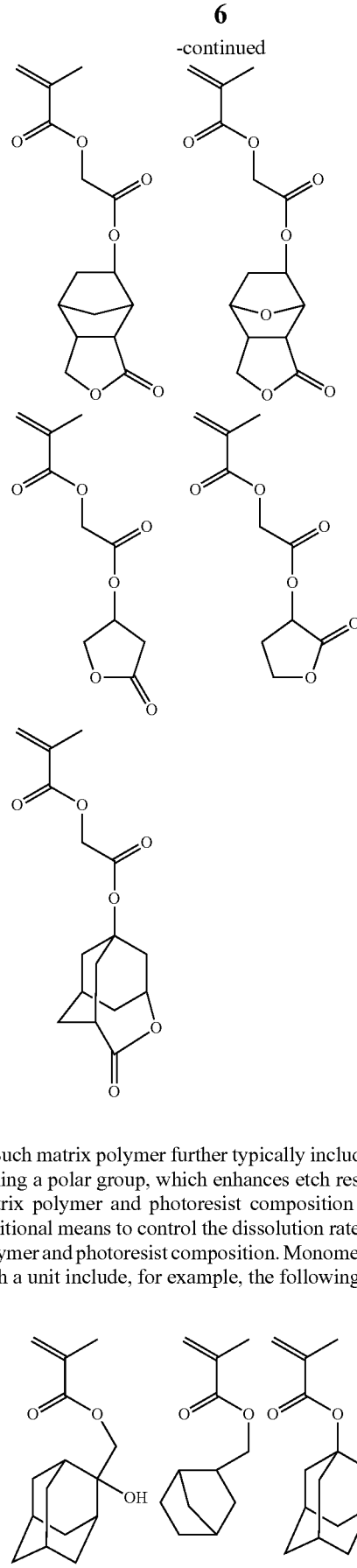

Such matrix polymer further typically includes a unit containing a polar group, which enhances etch resistance of the matrix polymer and photoresist composition and provides additional means to control the dissolution rate of the matrix polymer and photoresist composition. Monomers for forming such a unit include, for example, the following:

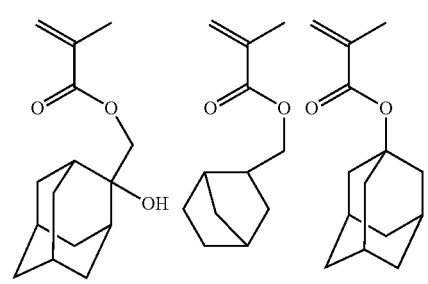

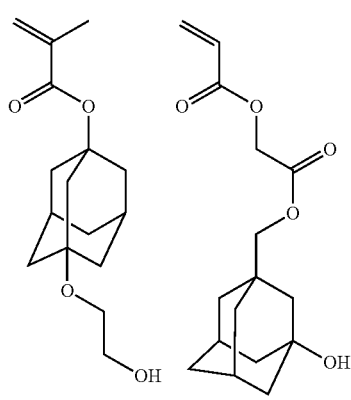
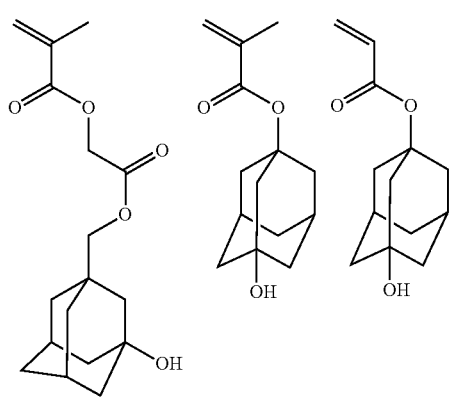
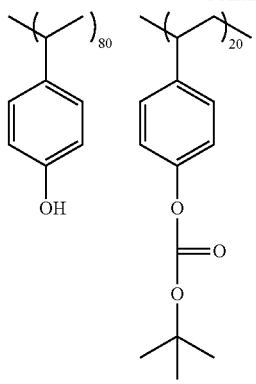
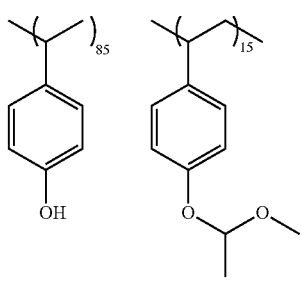
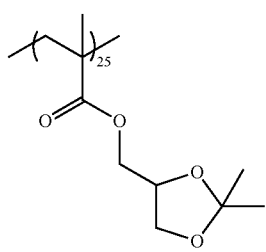

The matrix polymer can include one or more additional units of the types described above. Typically, the additional units for the matrix polymer will include the same or similar polymerizable group as those used for the monomers used to form the other units of the polymer, but may include other, different polymerizable groups in the same polymer backbone.

The matrix polymer has a higher surface energy than that of the additive polymer, described below, and should be substantially non-miscible with the additive polymer. As a result of the difference in surface energies, segregation of the additive polymer from the matrix polymer takes place during spin-coating. A suitable surface energy of the matrix polymer is typically from 20 to 50 mN/m, preferably from 30 to 40 mN/m.

While not to be limited thereto, exemplary matrix polymers include, for example, the following:

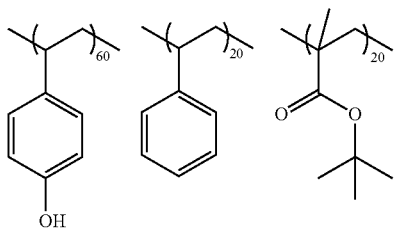
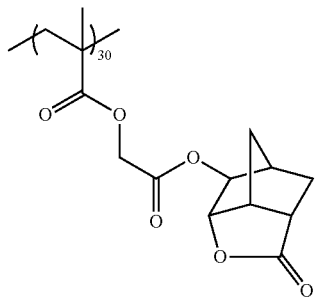
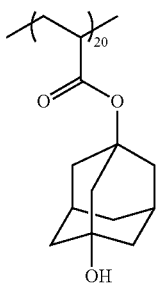

-continued
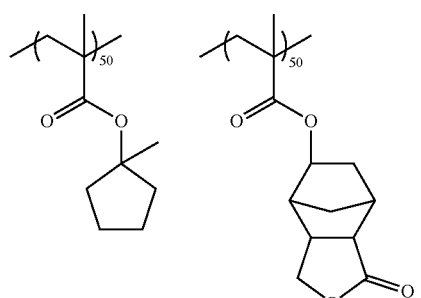
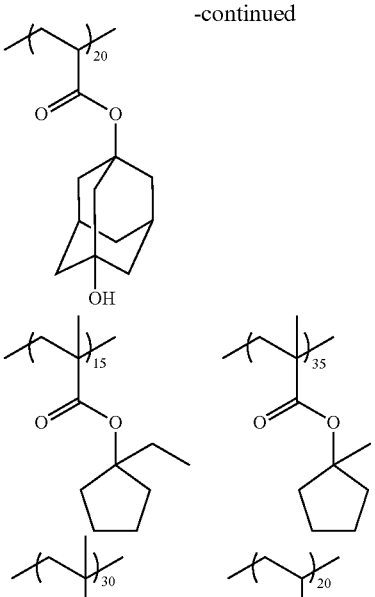
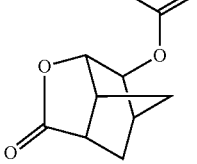
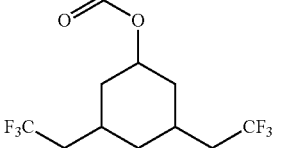
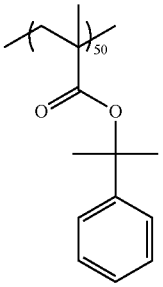
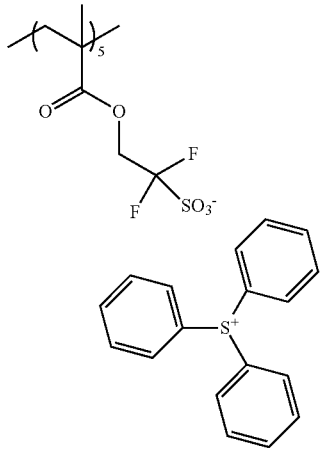
Suitable matrix polymers for use in the photoresist compositions of the invention are commercially available and can readily be made by persons skilled in the art. The matrix polymer is present in the resist composition in an amount sufficient to render an exposed coating layer of the resist developable in a suitable developer solution. Typically, the matrix polymer is present in the composition in an amount of from 50 to 95 wt % based on total solids of the resist composition. The weight average molecular weight $M_w$ of the matrix polymer is typically less than 100,000, for example, from 5000 to 100,000, more typically from 5000 to 15,000. Blends of two or more of the above-described matrix polymers can suitably be used in the photoresist compositions of the invention.

The additive polymer is a material that has a lower surface energy than that of the matrix polymer and should be substantially non-miscible with the matrix polymer. In this way, segregation or migration of the first additive to the top or upper portions of an applied photoresist layer during the coating process is facilitated. While the desired surface energy of the additive polymer will depend on the particular matrix polymer and its surface energy, the additive polymer surface energy is typically from 18 to 40 mN/m, preferably from 20 to 35 mN/m and more preferably from 29 to 33 mN/m. While the additive polymer migrates to the upper surface of the resist layer during the coating process, it is preferable that there be some intermixing between the additive polymer and matrix polymer immediately beneath the resist surface. Such intermixing is believed to aid in reducing surface inhibition in the resist layer by reduction or elimination of the acid generated in dark regions in the vicinity of the matrix polymer due to stray light. The extent of intermixing will depend, for example, on the difference in surface energy (SE) between the matrix polymer (MP) and additive polymer (AP) ($\Delta SE = SE_{MP} - SE_{AP}$). For given matrix and additive polymers, the degree of intermixing can be increased with reduced $\Delta SE$. The $\Delta SE$ is typically from 2 to 32 mN/m, preferably from 5 to 15 mN/m.

The additive polymers useful in the photoresist compositions are copolymers that have a plurality of distinct repeat units, for example, two, three or four distinct repeat units. The distinct units include at least polymerized units of a monomer of general formula (I) and a different unit containing a basic moiety as described below. The additive polymer is free of acid labile groups, for example, photoacid-labile tertiary alkyl esters, acetal and ketal groups, which groups are typically included in matrix polymers of positive-acting chemically amplified photoresists. The presence of such groups on the additive polymer could render the polymer insoluble in the developer, possibly leading to defects such as bridging defects in the formed resist pattern. As a result of the additive polymer's migration to the resist surface during coating and its basic functionality, micro-bridge defects in trench formation and missing contact hole defects caused by the presence of stray light in regions of the resist blocked by a photomask can be minimized or avoided.

The additive polymer is further preferably free of silicon. Silicon-containing polymers exhibit a significantly lower etch rate than organic photoresist polymers in certain etchants. As a result, aggregation of a silicon-containing additive polymer at the surface of an organic matrix polymer-based resist layer can cause cone defects during the etching process. The additive polymer may contain fluorine or can be free of fluorine. Preferred additive polymers are soluble in the same organic solvent(s) used to formulate the photoresist composition. Preferred additive polymers also will be soluble or become soluble upon post exposure bake (e.g., 120° C. for 60 seconds) in organic developers used in negative tone development processes.

The additive polymer includes a first unit formed from a monomer having the following general formula (I):

wherein P is a polymerizable functional group, $R_1$ is chosen from substituted and unsubstituted C1 to C20 linear, branched and cyclic hydrocarbons, preferably fluorinated and non-fluorinated C1 to C15 alkyl, more preferably fluorinated and non-fluorinated C3 to C8 alkyl and most preferably fluorinated and non-fluorinated C4 to C5 alkyl, with $R_1$ preferably being branched to provide a higher water receding contact angle when used in immersion lithography, and $R_1$ substitutions of haloalkyl and haloalcohol such as fluoroalkyl and fluoroalcohol being suitable; Z is a spacer unit chosen from substituted and unsubstituted linear or branched aliphatic (such as C1 to C6 alkylene) and aromatic hydrocarbons, and combinations thereof, optionally with one or more linking moiety chosen from —O—, —S— and —COO—, and n is an integer from 0 to 5.

The polymerizable functional group P can be chosen, for example, from the following general formulae (P-1), (P-2) and (P-3):

wherein $R_2$ is chosen from hydrogen, fluorine and fluorinated and non-fluorinated C1 to C3 alkyl; and X is oxygen or sulfur;

wherein $R_3$ is chosen from hydrogen, fluorine and fluorinated and non-fluorinated C1 to C3 alkyl; and

wherein m is an integer from 0 to 3.

Preferably, the additive polymer comprises a first unit formed from a monomer having the following general formula (I-1):

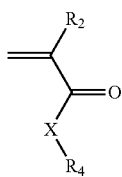

(I-1)

wherein: $R_2$ and X are as defined above; and $R_4$ is chosen from substituted and unsubstituted C1 to C20 linear, branched and cyclic hydrocarbons, preferably fluorinated and non-fluorinated C1 to C15 alkyl, more preferably fluorinated and non-fluorinated C3 to C8 alkyl and most preferably fluorinated and non-fluorinated C4 to C5 alkyl, with $R_4$ preferably being branched to provide a higher water receding contact angle when used in immersion lithography, and $R_4$ substitutions of haloalkyl and haloalcohol such as fluoroalkyl and fluoroalcohol being suitable;

Exemplary suitable monomers of general formula (I) are described below, but are not limited to these structures. For purposes of these structures, "$R_2$" and "X" are as defined above.

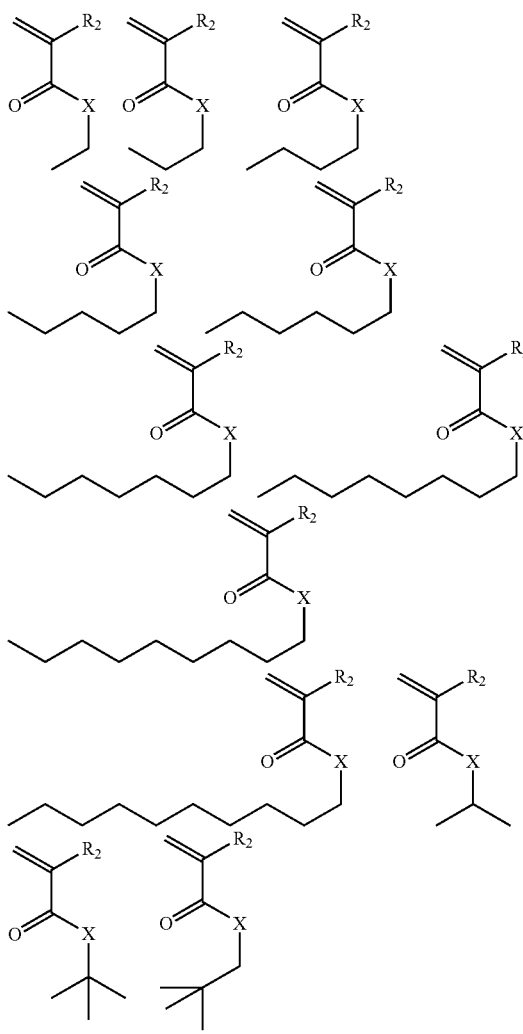

-continued

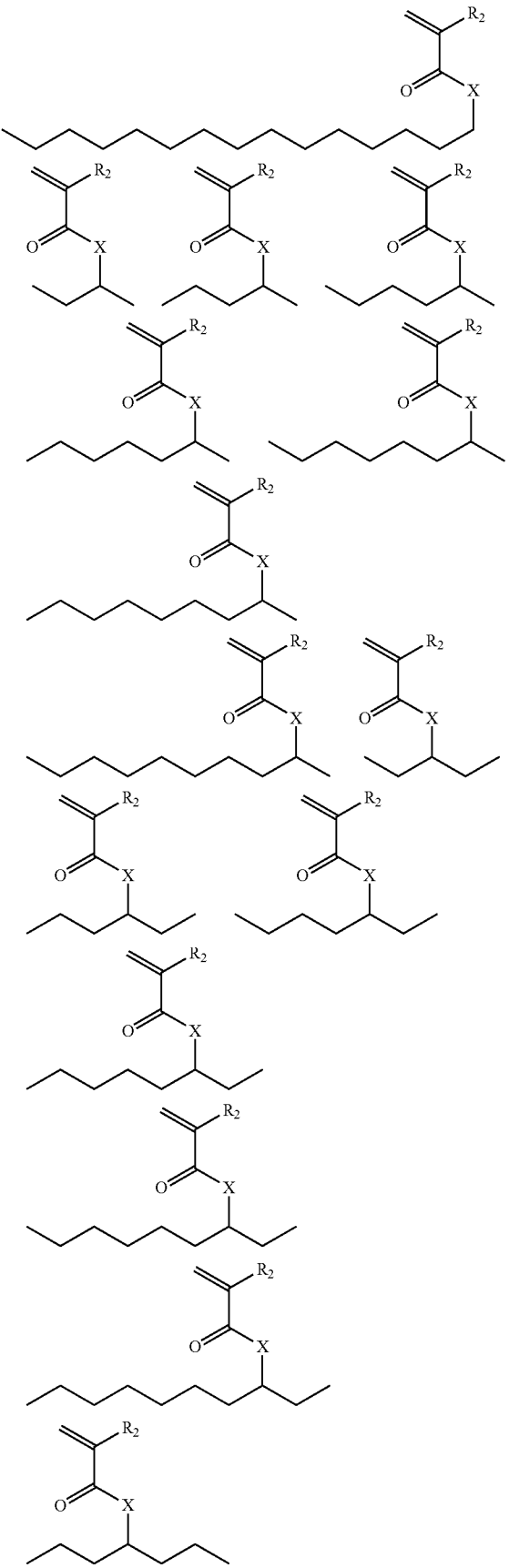

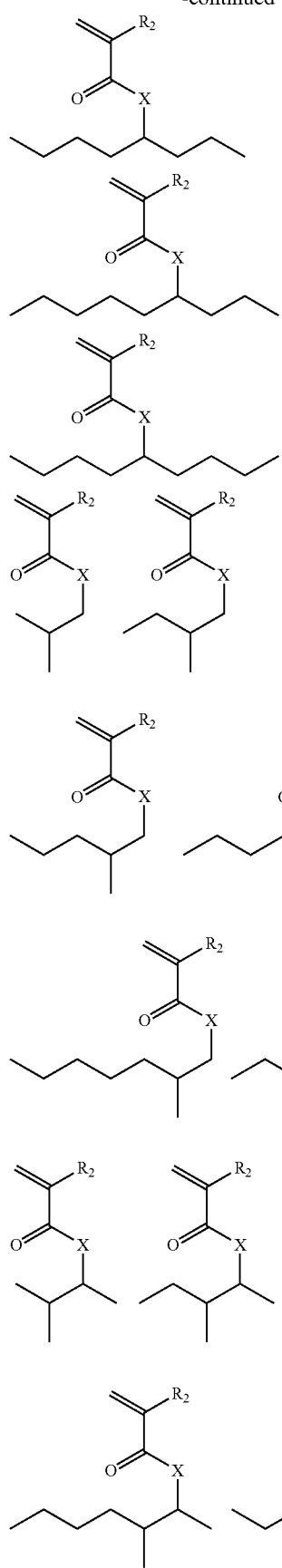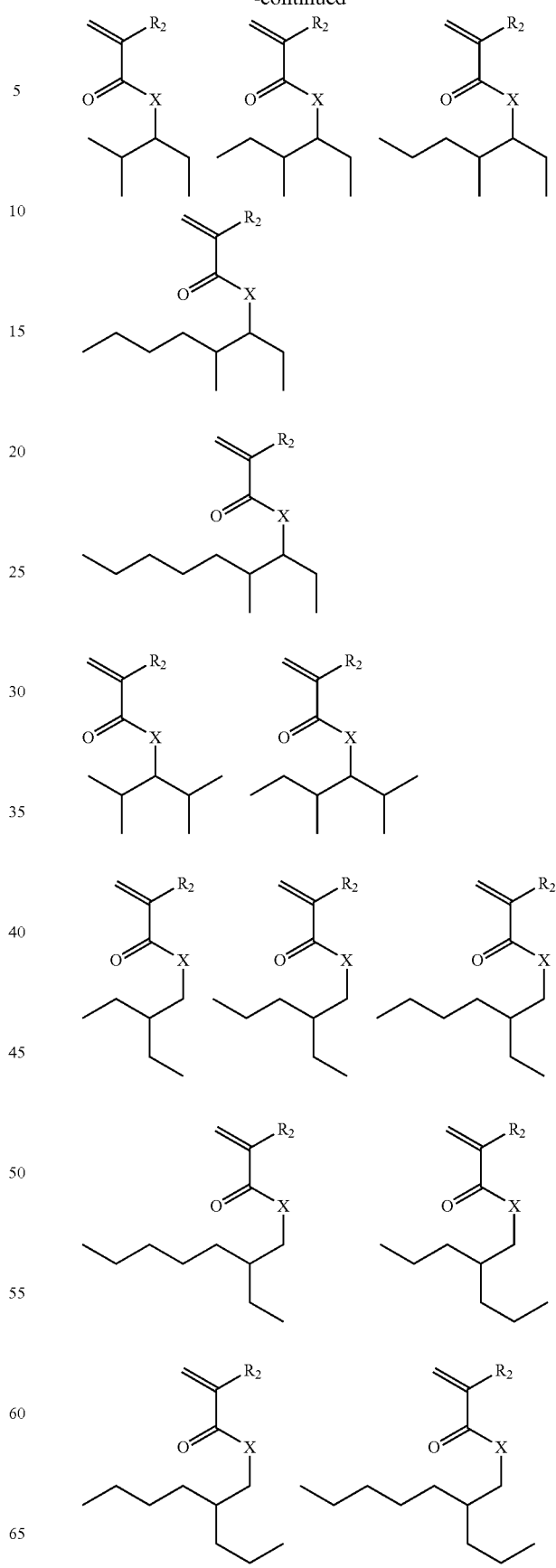

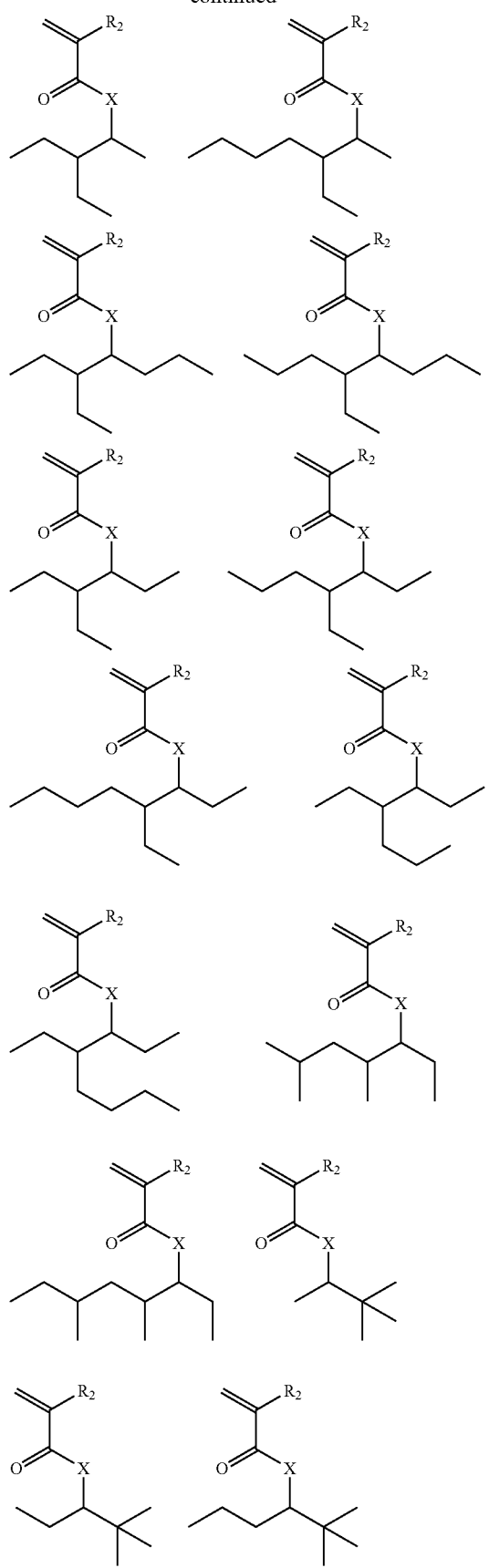
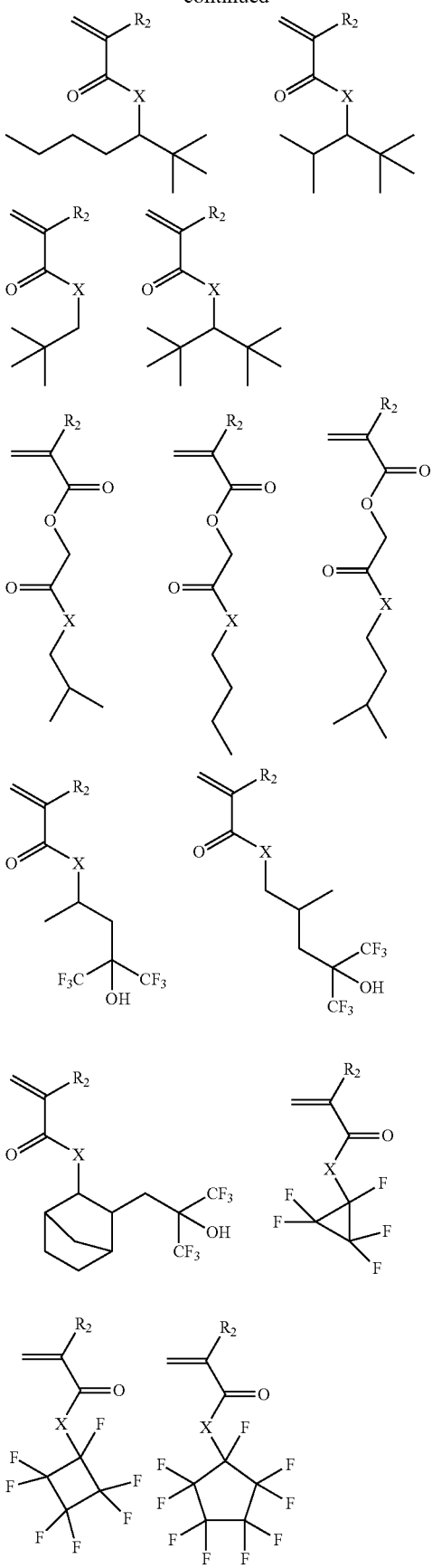

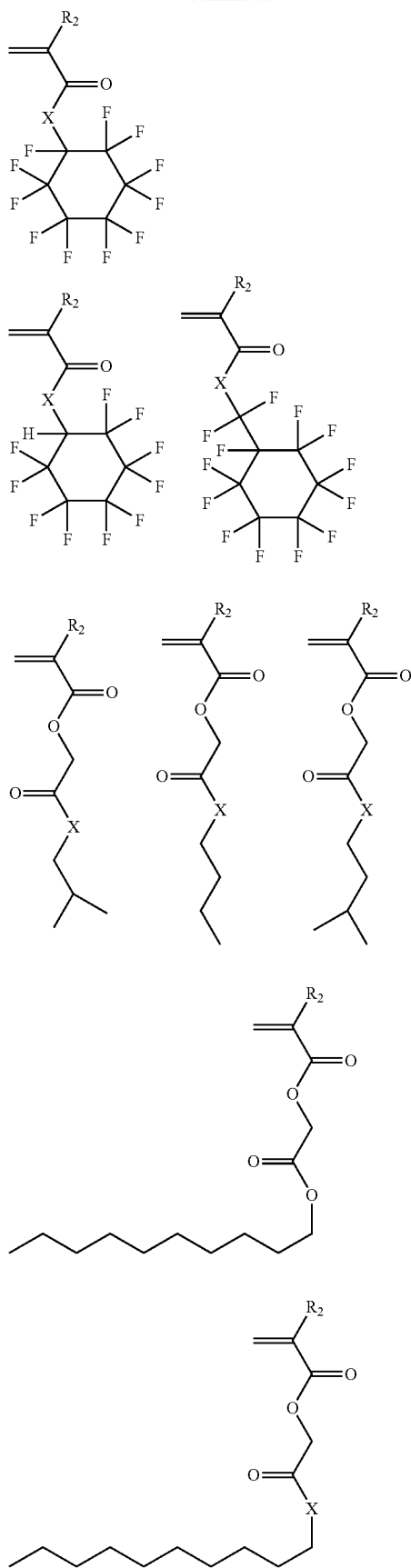
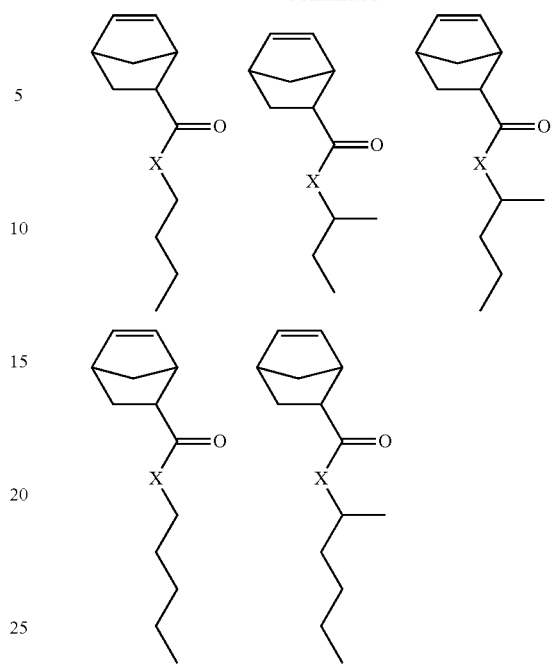

The additive polymer further includes a unit, different from the first unit, which is formed from a monomer having a basic moiety. This unit is present for purposes of neutralizing acid in the regions of the photoresist intended to be unexposed (dark), which acid is generated by stray light in the surface region of the photoresist layer. This is believed to allow for improvement in depth of focus in the defocus area and exposure latitude by controlling unwanted deprotection reaction in the unexposed areas. As a result, irregularities in the profile, for example, necking and T-topping, in formed resist patterns can be minimized or avoided.

The basic moiety-containing unit is preferably formed from a monomer chosen from one or more of: monomers whose polymerizable unit is chosen from (alkyl)acrylate, vinyl, allyl and maleimide, and whose basic moiety is a nitrogen-containing group chosen from: amines such as amino ethers, pyridines, anilines, indazoles, pyrroles, pyrazoles, pyrazines, guanidiniums and imines; amides such as carbamates, pyrrolidinones, maleimides, imidazoles and imides; and derivates thereof. Of these, (alkyl)acrylate polymerizable groups and amine-containing basic moieties are preferred. Exemplary suitable monomers for use in forming a basic moiety-containing unit of the additive polymer include the following:

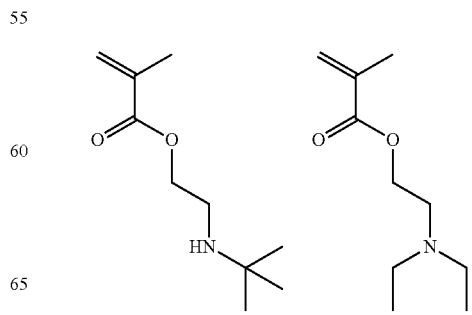

21
-continued
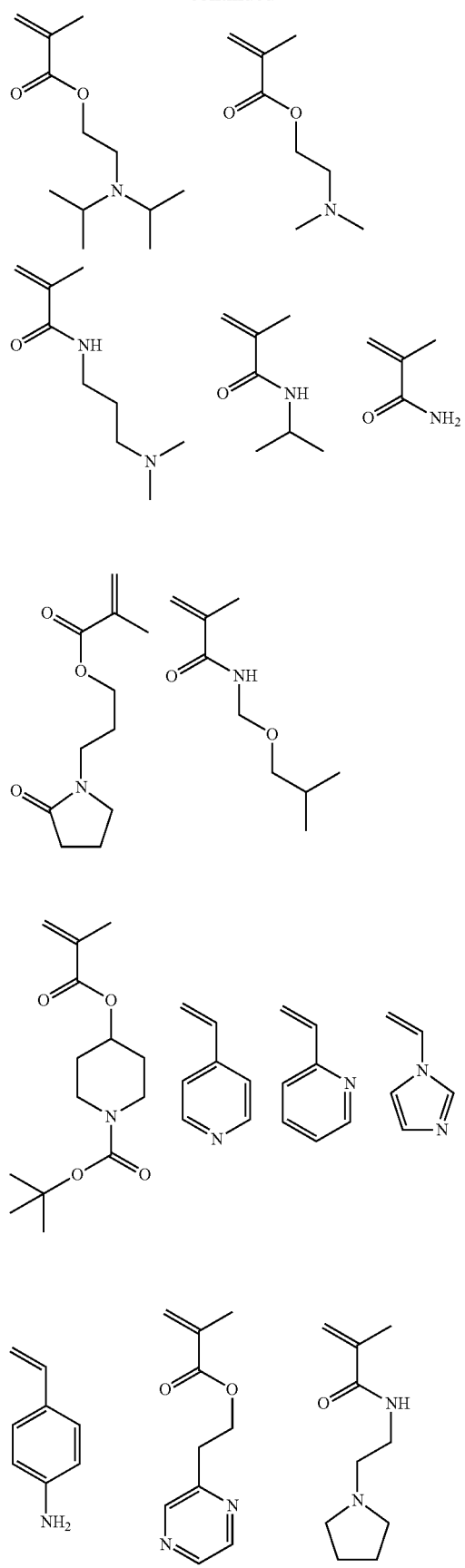
22
-continued
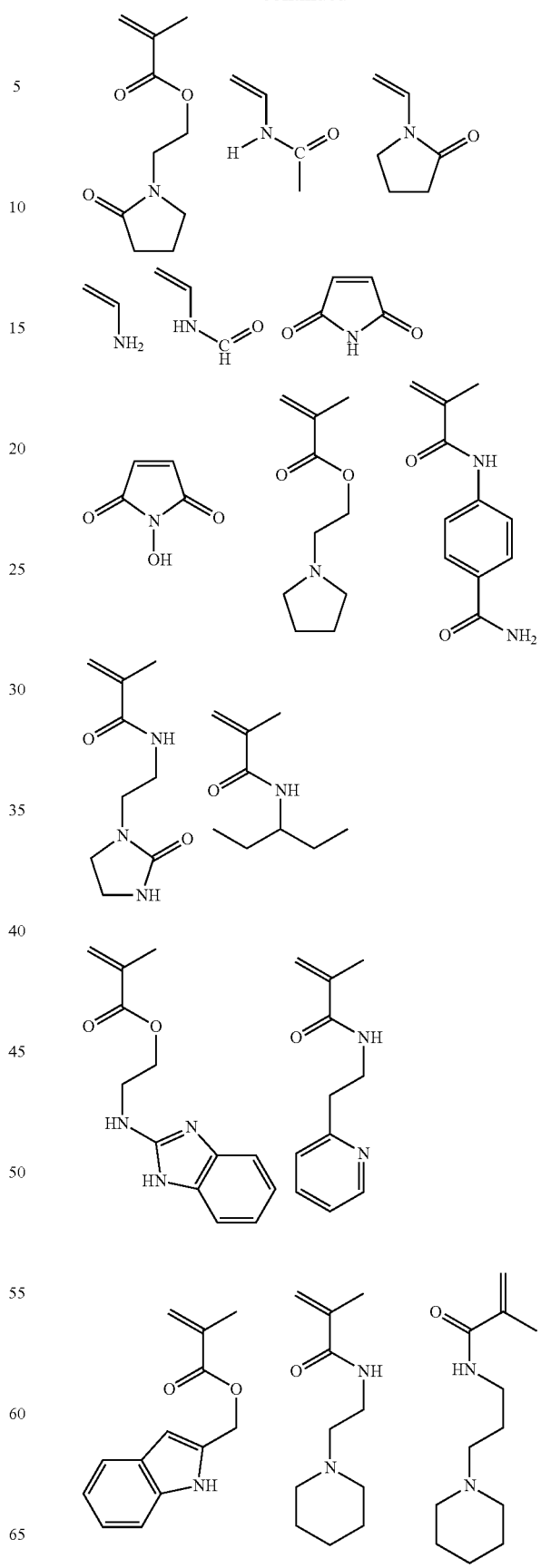

-continued

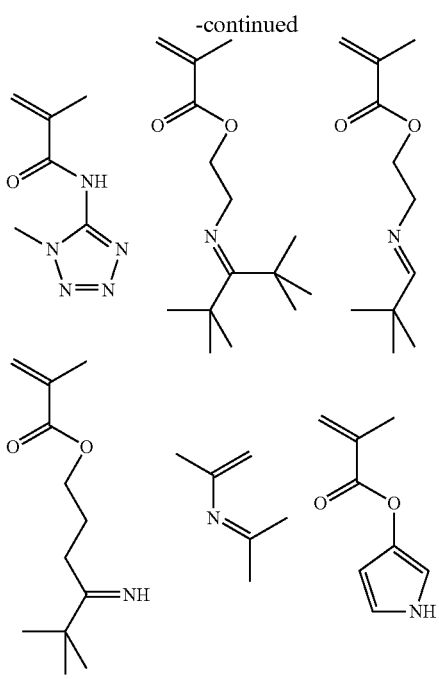

Of these monomers for use in forming the basic moiety-containing, the following are preferred:

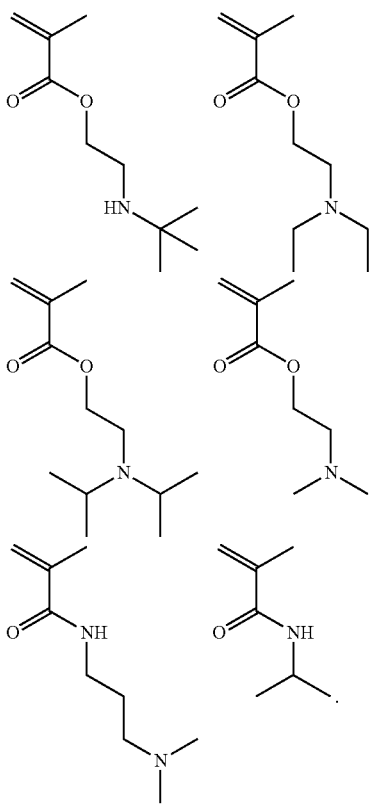

The content of the basic moiety-containing unit(s) in the additive polymer should be sufficient to substantially or completely eliminate acid-induced deprotection reaction in the dark regions of the photoresist layer while allowing such reaction to occur in the bright regions (those regions intended to be exposed) of the layer. The desired content of the basic moiety-containing unit(s) in the additive polymer will depend, for example, on the content of the photoacid generator in the photoresist layer. The basic moiety-containing units, however, tend to have a relatively high surface energy such that an excessively high content can detrimentally impact the segregation of the additive polymer from the matrix polymer. The pKa (in water) of the basic moiety-containing monomer is preferably from 5 to 50, more preferably from 8 to 40 and most preferably from 10 to 35. The pKa value of the basic moiety-containing monomer and the additive polymer as a whole will typically have the same or substantially the same value. The inclusion of a monomer unit of general formula I and of a basic moiety-containing unit allows for fine tuning of the surface energy of the additive polymer relative to the matrix polymer and thus the degree of intermixing (and segregation) of the two polymers in a simple manner. Typically the content of the basic moiety-containing unit(s) in the additive polymer will be from 0.1 to 30 mole %, preferably from 0.5 to 20 mole % and more preferably from 2 to 15 mole %, based on the additive polymer.

Exemplary additive polymers useful in the photoresist compositions include the following:

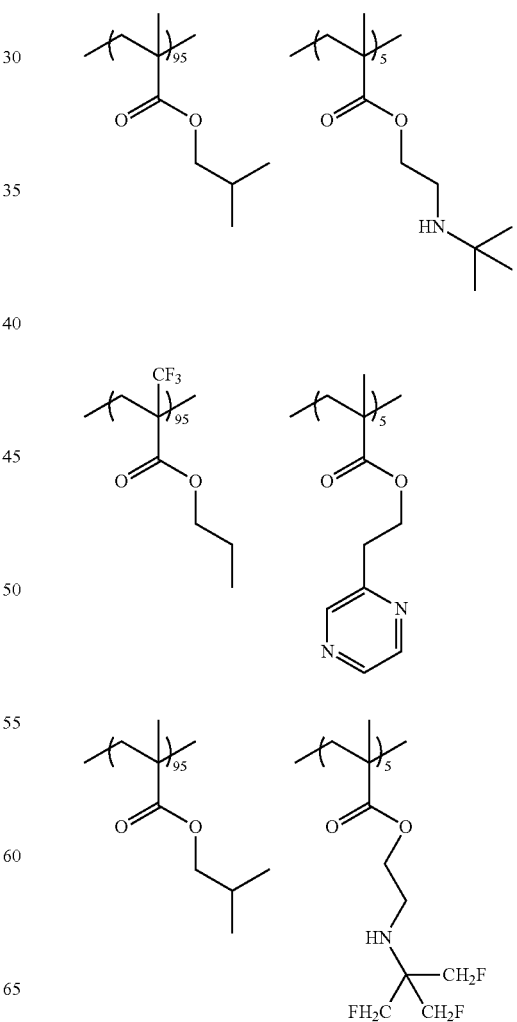

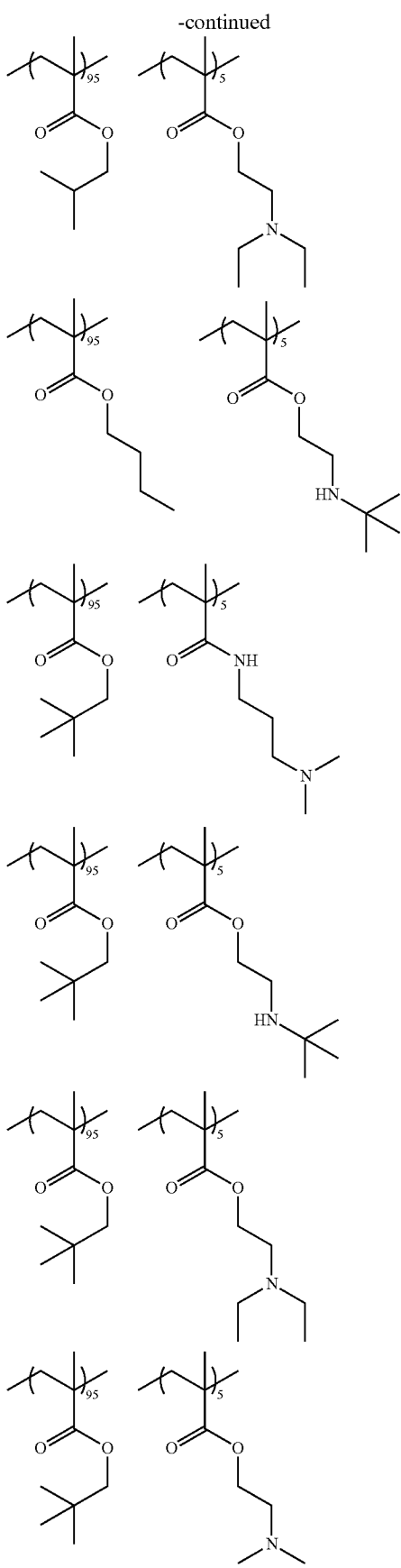

The photoresist compositions typically include a single additive polymer, but can optionally include one or more additional additive polymer as described above. Suitable polymers and monomers for use in the photoresist compositions are commercially available and/or can readily be made by persons skilled in the art.

The additive polymer is typically present in the photoresist composition in a relatively small amount, for example, in an amount of from 0.1 to 10 wt %, preferably from 0.5 to 5 wt %, more preferably from 1 to 3 wt %, based on total solids of the photoresist composition. The content of the additive polymer will depend, for example, on the content of the photoacid generator in the photoresist layer, the content of the basic moiety-containing unit(s) in the additive polymer, and whether the lithography is a dry or immersion-type process. For example, the additive polymer lower limit for immersion lithography is generally dictated by the need to prevent leaching of the resist components. An excessively high additive polymer content will typically result in pattern degradation. The weight average molecular weight of the additive polymer is typically less than 400,000, preferably from 5000 to 50,000, more preferably from 5000 to 25,000. Suitable additive polymers and monomers for making the additive polymers for use in the photoresist compositions of the invention are commercially available and/or can be made by persons skilled in the art.

The photosensitive composition further comprises a photoacid generator (PAG) employed in an amount sufficient to generate a latent image in a coating layer of the composition upon exposure to activating radiation. For example, the photoacid generator will suitably be present in an amount of from about 1 to 20 wt % based on total solids of the photoresist composition. Typically, lesser amounts of the photoactive component will be suitable for chemically amplified resists.

Suitable PAGs are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate, nitrobenzyl derivatives, for example, 2-nitrobenzyl p-toluenesulfonate, 2,6-dinitrobenzyl p-toluenesulfonate, and 2,4-dinitrobenzyl p-toluenesulfonate; sulfonic acid esters, for example, 1,2,3-tris(methanesulfonyloxy)benzene, 1,2,3-tris (trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenensulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. One or more of such PAGs can be used.

Suitable solvents for the photoresist compositions of the invention include, for example: glycol ethers such as 2-methoxyethyl ether (diglyme), ethylene glycol monomethyl ether, and propylene glycol monomethyl ether; propylene glycol monomethyl ether acetate; lactates such as methyl lactate and ethyl lactate; propionates such as methyl propionate, ethyl propionate, ethyl ethoxy propionate and methyl-2-hydroxy isobutyrate; Cellosolve esters such as methyl Cellosolve acetate; aromatic hydrocarbons such as toluene and xylene; and ketones such as methylethyl ketone, cyclohexanone and 2-heptanone. A blend of solvents such as a blend of two, three or more of the solvents described above also are suitable. The solvent is typically present in the composition in an amount of from 90 to 99 wt %, more typically from 95 to 98 wt %, based on the total weight of the photoresist composition.

Other optional additives for the photoresist compositions include, for example, actinic and contrast dyes, anti-striation agents, plasticizers, speed enhancers, sensitizers, and the like. Such optional additives if used are typically present in the composition in minor amounts such as from 0.1 to 10 wt % based on total solids of the photoresist composition, although fillers and dyes can be present in relatively large concentrations, for example, from 5 to 30 wt % based on total solids of the photoresist composition.

A preferred optional additive of resist compositions of the invention is an added base which can enhance resolution of a developed resist relief image. Suitable basic quenchers include, for example: linear and cyclic amides and derivatives thereof such as N,N-bis(2-hydroxyethyl)pivalamide, N,N-Diethylacetamide, N1,N1,N3,N3-tetrabutylmalonamide, 1-methylazepan-2-one, 1-allylazepan-2-one and tert-butyl 1,3-dihydroxy-2-(hydroxymethyl)propan-2-ylcarbamate; aromatic amines such as pyridine, and di-tert-butyl pyridine; aliphatic amines such as triisopropanolamine, n-tert-butyldiethanolamine, tris(2-acetoxy-ethyl)amine, 2,2',2'',2'''-(ethane-1,2-diylbis(azanetriyl))tetraethanol, and 2-(dibutylamino)ethanol, 2,2',2''-nitrilotriethanol; cyclic aliphatic amines such as 1-(tert-butoxycarbonyl)-4-hydroxypiperidine, tert-butyl 1-pyrrolidinecarboxylate, tert-butyl 2-ethyl-1H-imidazole-1-carboxylate, di-tert-butyl piperazine-1,4-dicarboxylate and N (2-acetoxy-ethyl)morpholine. Of these basic quenchers, 1-(tert-butoxycarbonyl)-4-hydroxypiperidine and triisopropanolamine are preferred. The added base is suitably used in relatively small amounts, for example, from 1 to 20 wt % relative to the PAG, more typically from 5 to 15 wt % relative to the PAG.

The photoresists used in accordance with the invention are generally prepared following known procedures. For example, a resist of the invention can be prepared as a coating composition by dissolving the components of the photoresist in a suitable solvent, for example, one or more of: a glycol ether such as 2-methoxyethyl ether (diglyme), ethylene glycol monomethyl ether, propylene glycol monomethyl ether; propylene glycol monomethyl ether acetate; lactates such as ethyl lactate or methyl lactate, with ethyl lactate being preferred; propionates, particularly methyl propionate, ethyl propionate and ethyl ethoxy propionate; a Cellosolve ester such as methyl Cellosolve acetate; an aromatic hydrocarbon such toluene or xylene; or a ketone such as methylethyl ketone, cyclohexanone and 2-heptanone. The desired total solids content of the photoresist will depend on factors such as the particular polymers in the composition, final layer thickness and exposure wavelength. Typically the solids content of the photoresist varies from 1 to 10 wt %, more typically from 2 to 5 wt %, based on the total weight of the photoresist composition.

The invention further provides methods for forming a photoresist relief image and producing an electronic device using photoresists of the invention. The invention also provides novel articles of manufacture comprising substrates coated with a photoresist composition of the invention. Methods in accordance with the invention will now be described with reference to FIG. 2A-C, which illustrates an exemplary process flow for forming a photolithographic pattern by a negative tone development process.

Figure 2:
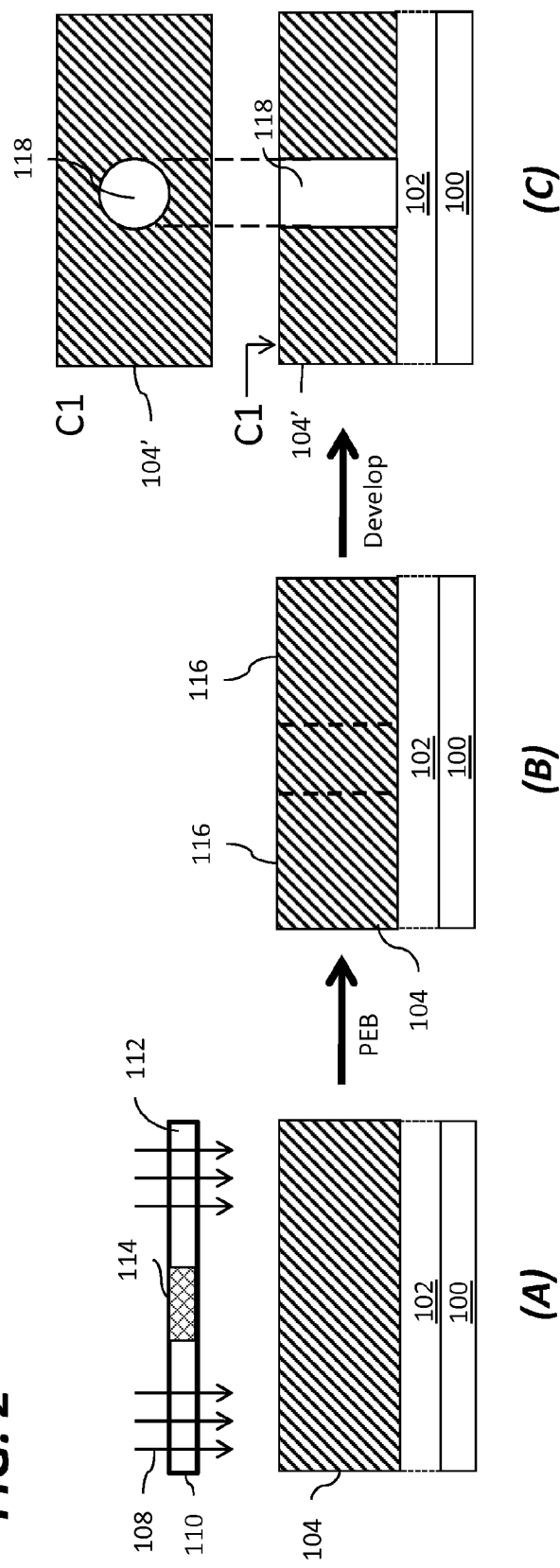
FIG. 2A-C illustrates a process flow for forming a photolithographic pattern in accordance with the invention.

FIG. 2A depicts in cross-section a substrate 100 which may include various layers and features. The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, and may have one or more layers and patterned features formed on a surface thereof. One or more layers to be patterned 102 may be provided over the substrate 100. Optionally, the underlying base substrate material itself may be patterned, for example, when it is desired to form trenches in the substrate material. In the case of patterning the base substrate material itself, the pattern shall be considered to be formed in a layer of the substrate.

The layers may include, for example, one or more conductive layers such as layers of aluminum, copper, molybdenum, tantalum, titanium, tungsten, alloys, nitrides or silicides of such metals, doped amorphous silicon or doped polysilicon, one or more dielectric layers such as layers of silicon oxide, silicon nitride, silicon oxynitride, or metal oxides, semiconductor layers, such as single-crystal silicon, and combinations thereof. The layers to be etched can be formed by various techniques, for example, chemical vapor deposition (CVD) such as plasma-enhanced CVD, low-pressure CVD or epitaxial growth, physical vapor deposition (PVD) such as sputtering or evaporation, or electroplating. The particular thickness of the one or more layers to be etched 102 will vary depending on the materials and particular devices being formed.

Depending on the particular layers to be etched, film thicknesses and photolithographic materials and process to be used, it may be desired to dispose over the layers 102 a hard mask layer and/or a bottom antireflective coating (BARC) over which a photoresist layer 104 is to be coated. Use of a hard mask layer may be desired, for example, with very thin resist layers, where the layers to be etched require a significant etching depth, and/or where the particular etchant has poor resist selectivity. Where a hard mask layer is used, the resist patterns to be formed can be transferred to the hard mask layer which, in turn, can be used as a mask for etching the underlying layers 102. Suitable hard mask materials and formation methods are known in the art. Typical materials include, for example, tungsten, titanium, titanium nitride, titanium oxide, zirconium oxide, aluminum oxide, aluminum oxynitride, hafnium oxide, amorphous carbon, silicon oxynitride and silicon nitride. The hard mask layer can include a single layer or a plurality of layers of different materials. The hard mask layer can be formed, for example, by chemical or physical vapor deposition techniques.

A bottom antireflective coating may be desirable where the substrate and/or underlying layers would otherwise reflect a significant amount of incident radiation during photoresist exposure such that the quality of the formed pattern would be adversely affected. Such coatings can improve depth-of-focus, exposure latitude, linewidth uniformity and CD control. Antireflective coatings are typically used where the resist is exposed to deep ultraviolet light (300 nm or less), for example, KrF excimer laser light (248 nm) or ArF excimer laser light (193 nm). The antireflective coating can comprise a single layer or a plurality of different layers. Suitable antireflective materials and methods of formation are known in the art. Antireflective materials are commercially available, for example, those sold under the AR™ trademark by Rohm and Haas Electronic Materials LLC (Marlborough, Mass. USA), such as AR™ 40A and AR™ 124 antireflectant materials.

A photoresist layer 104 formed from a composition of the invention as described above is applied on the substrate. The photoresist composition is typically applied to the substrate by spin-coating. During spin-coating, the additive polymer in the photoresist segregates to the upper surface of the formed resist layer typically with intermixing with the matrix polymer in regions immediately below the upper surface. The solids content of the coating solution can be adjusted to provide a desired film thickness based upon the specific coating equipment utilized, the viscosity of the solution, the speed of the coating tool and the amount of time allowed for spinning. A typical thickness for the photoresist layer 104 is from about 500 to 3000 Å.

The photoresist layer can next be softbaked to minimize the solvent content in the layer, thereby forming a tack-free coating and improving adhesion of the layer to the substrate. The softbake can be conducted on a hotplate or in an oven, with a hotplate being typical. The softbake temperature and time will depend, for example, on the particular material of the photoresist and thickness. Typical softbakes are conducted at a temperature of from about 90 to 150° C., and a time of from about 30 to 90 seconds.

The photoresist layer 104 is next exposed to activating radiation 108 through a photomask 110 to create a difference in solubility between exposed and unexposed regions. References herein to exposing a photoresist composition to radiation that is activating for the composition indicates that the radiation is capable of forming a latent image in the photoresist composition. The photomask has optically transparent and optically opaque regions 112, 114 corresponding to regions of the resist layer to remain and be removed, respectively, in a subsequent development step. The exposure wavelength is typically sub-400 nm, sub-300 nm or sub-200 nm, with 248 nm, 193 nm and EUV wavelengths being typical. Photoresist materials can further be used with electron beam exposure. The methods find use in immersion or dry (non-immersion) lithography techniques. The exposure energy is typically from about 10 to 80 mJ/cm$^2$, dependent upon the exposure tool and the components of the photosensitive composition.

Following exposure of the photoresist layer 104, a post-exposure bake (PEB) is performed. The PEB can be conducted, for example, on a hotplate or in an oven. Conditions for the PEB will depend, for example, on the particular photoresist composition and layer thickness. The PEB is typically conducted at a temperature of from about 80 to 150° C., and a time of from about 30 to 90 seconds. A latent image 116 defined by the boundary (dashed line) between polarity-switched and unswitched regions (corresponding to exposed and unexposed regions, respectively) is formed in the photoresist as shown in FIG. 2B. The basic moiety of the additive polymer is believed to prevent polarity switch in dark regions of the photoresist layer where stray or scattered light may be present, resulting in a latent image with vertical walls. This is a result of neutralization of acid generated by the PAG in the dark regions. As a result, cleavage of the acid-labile groups in those regions can be substantially prevented.

The exposed photoresist layer is next developed to remove unexposed regions of the photoresist layer 104, leaving exposed regions forming an open resist pattern 104' with contact hole pattern 118 having vertical sidewalls as shown in FIG. 2C. The developer is typically an organic developer, for example, a solvent chosen from ketones, esters, ethers, hydrocarbons, and mixtures thereof. Suitable ketone solvents include, for example, acetone, 2-hexanone, 5-methyl-2-hexanone, 2-heptanone, 4-heptanone, 1-octanone, 2-octanone, 1-nonanone, 2-nonanone, diisobutyl ketone, cyclohexanone, methylcyclohexanone, phenylacetone, methyl ethyl ketone and methyl isobutyl ketone. Suitable ester solvents include, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate and propyl lactate. Suitable ether solvents include, for example, dioxane, tetrahydrofuran and glycol ether solvents, for example, ethylene glycol monomethyl ether, propylene glycol monomethyl ether, ethylene glycol monoethyl ether, propylene glycol monoethyl ether, diethylene glycol monomethyl ether, triethylene glycol monoethyl ether and methoxymethyl butanol. Suitable amide solvents include, for example, N-methyl-2-pyrrolidone, N,N-dimethylacetamide and N,N-dimethylformamide. Suitable hydrocarbon solvents include, for example, aromatic hydrocarbon solvents such as toluene and xylene. In addition, mixtures of these solvents, or one or more of the listed solvents mixed with a solvent other than those described above or mixed with water can be used. Other suitable solvents include those used in the photoresist composition. The developer is preferably 2-heptanone or a butyl acetate such as n-butyl acetate.

Mixtures of organic solvents can be employed as a developer, for example, a mixture of a first and second organic solvent. The first organic solvent can be chosen from hydroxy alkyl esters such as methyl-2-hydroxyisobutyrate and ethyl lactate; and linear or branched $C_5$ to $C_6$ alkoxy alkyl acetates such as propylene glycol monomethyl ether acetate (PGMEA). Of the first organic solvents, 2-heptanone and 5-methyl-2-hexanone are preferred. The second organic solvent can be chosen from linear or branched unsubstituted $C_6$ to $C_8$ alkyl esters such as n-butyl acetate, n-pentyl acetate, n-butyl propionate, n-hexyl acetate, n-butyl butyrate and isobutyl butyrate; and linear or branched $C_8$ to $C_9$ ketones such as 4-octanone, 2,5-dimethyl-4-hexanone and 2,6-dimethyl-4-heptanone. Of the second organic solvents, n-butyl acetate, n-butyl propionate and 2,6-dimethyl-4-heptanone are preferred. Preferred combinations of the first and second organic solvent include 2-heptanone/n-butyl propionate, cyclohexanone/n-butyl propionate, PGMEA/n-butyl propionate, 5-methyl-2-hexanone/n-butyl propionate, 2-heptanone/2,6-dimethyl-4-heptanone and 2-heptanone/n-butyl acetate. Of these, 2-heptanone/n-butyl acetate and 2-heptanone/n-butyl propionate are particularly preferred.

The organic solvents are typically present in the developer in a combined amount of from 90 wt % to 100 wt %, more typically greater than 95 wt %, greater than 98 wt %, greater than 99 wt % or 100 wt %, based on the total weight of the developer.

The developer material may include optional additives, for example, surfactants such as described above with respect to the photoresist. Such optional additives typically will be present in minor concentrations, for example, in amounts of from about 0.01 to 5 wt % based on the total weight of the developer.

The developer is typically applied to the substrate by spin-coating. The development time is for a period effective to remove the unexposed regions of the photoresist, with a time of from 5 to 30 seconds being typical. Development is typically conducted at room temperature. The development process can be conducted without use of a cleaning rinse following development. In this regard, it has been found that the development process can result in a residue-free wafer surface rendering such extra rinse step unnecessary.

The BARC layer, if present, is selectively etched using resist pattern 104' as an etch mask, exposing the underlying hardmask layer. The hardmask layer is next selectively etched, again using the resist pattern 104' as an etch mask, resulting in patterned BARC and hardmask layers. Suitable etching techniques and chemistries for etching the BARC layer and hardmask layer are known in the art and will depend, for example, on the particular materials of these layers. Dry-etching processes such as reactive ion etching are typical. The resist pattern 104' and patterned BARC layer are next removed from the substrate using known techniques, for example, oxygen plasma ashing.

Using the hardmask pattern as an etch mask, the one or more layers 102 are selectively etched. Suitable etching techniques and chemistries for etching the underlying layers 102 are known in the art, with dry-etching processes such as reactive ion etching being typical. The patterned hardmask layer can next be removed from the substrate surface using known techniques, for example, a dry-etching process such as reactive ion etching. The resulting structure is a pattern of etched features. In an alternative exemplary method, it may be desirable to pattern the layers 102 directly using the resist pattern 104' without the use of a hardmask layer. Whether direct patterning is employed will depend on factors such as the materials involved, resist selectivity, resist pattern thickness and pattern dimensions.

EXAMPLES

Matrix Polymer (MP) Synthesis

The following monomers were employed in the syntheses of photoresist polymers (PP) as described below:

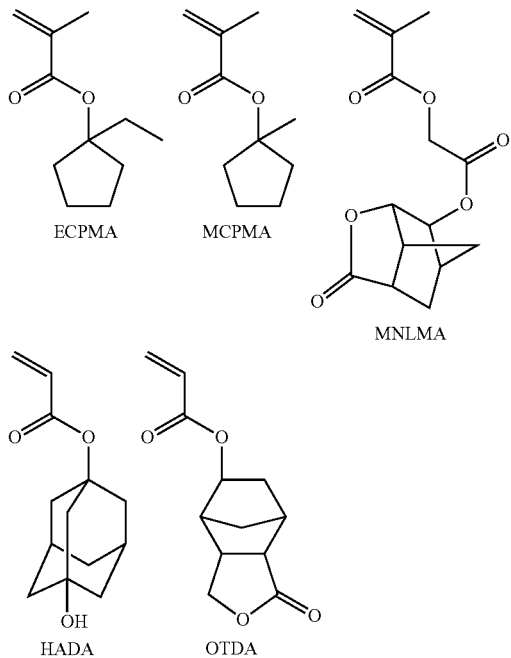

ECPMA    MCPMA    MNLMA

HADA    OTDA

Example 1

Synthesis of Poly(ECPMA/MCPMA/MNLMA/HADA) (MP-1)

Monomers of ECPMA (5.092 g), MCPMA (10.967 g), MNLMA (15.661 g) and HADA (8.280 g) were dissolved in 60 g of propylene glycol monomethyl ether acetate (PG-MEA). The monomer solution was degassed by bubbling with nitrogen for 20 min. PGMEA (27.335 g) was charged into a 500 mL three-neck flask equipped with a condenser and a mechanical stirrer and was degassed by bubbling with nitrogen for 20 min. Subsequently, the solvent in the reaction flask was brought to a temperature of 80° C. V601 (dimethyl-2,2-azodiisobutyrate) (0.858 g) was dissolved in 8 g of PGMEA and the initiator solution was degassed by bubbling with nitrogen for 20 min. The initiator solution was added into the reaction flask and then monomer solution was fed into the reactor dropwise over a 3 hour period under rigorous stifling and nitrogen environment. After monomer feeding was complete, the polymerization mixture was left standing for one additional hour at 80° C. After a total of 4 hours of polymerization time (3 hours of feeding and 1 hour of post-feeding stirring), the polymerization mixture was allowed to cool down to room temperature. Precipitation was carried out in methyl tert-butyl ether (MTBE) (1634 g). The power precipitated was collected by filtration, air-dried overnight, re-dissolved in 120 g of THF, and re-precipitated into MTBE (1634 g). The final polymer was filtered, air-dried overnight and further dried under vacuum at 60° C. for 48 hours to give 31.0 g of poly(ECPMA/MCPMA/MNLMA/HADA) (15/35/30/20) copolymer (MP-1) (Mw=20,120 and Mw/Mn=1.59).

Example 2

Synthesis of Poly(MCPMA/OTDA/HADA) (MP-2)

Monomers of MCPMA (17.233 g), OTDA (13.695 g) and HADA (9.108 g) were dissolved in 60 g of PGMEA. The monomer solution was degassed by bubbling with nitrogen for 20 min. PGMEA (30.837 g) was charged into a 500 mL three-neck flask equipped with a condenser and a mechanical stirrer and was degassed by bubbling with nitrogen for 20 min. Subsequently the solvent in the reaction flask was brought to a temperature of 80° C. V601 (dimethyl-2,2-azodiisobutyrate) (2.359 g) was dissolved in 8 g of PGMEA and the initiator solution was degassed by bubbling with nitrogen for 20 min. The initiator solution was added into the reaction flask and then monomer solution was fed into the reactor dropwise over the 3 hour period under rigorous stirring and nitrogen environment. After monomer feeding was complete, the polymerization mixture was left standing for one additional hour at 80° C. After a total of 4 hours of polymerization time (3 hours of feeding and 1 hour of post-feeding stifling), the polymerization mixture was allowed to cool down to room temperature. Precipitation was carried out MTBE (1694 g). The power precipitated was collected by filtration, air-dried overnight, re-dissolved in 120 g of THF, and re-precipitated into MTBE (1694 g). The final polymer was filtered, air-dried overnight and further dried under vacuum at 60° C. for 48 hours to give 28.535 g of poly(MCPMA/OTDA/HADA) (50/30/20) copolymer (MP-2) (Mw=13,474 and Mw/Mn=1.64).

Example 3

Synthesis of Poly(MCPMA/OTDA) (MP-3)

Monomers of MCPMA (17.234 g), and OTDA (22.766 g) were dissolved in 60 g of PGMEA. The monomer solution was degassed by bubbling with nitrogen for 20 min PGMEA (30.837 g) was charged into a 500 mL three-neck flask equipped with a condenser and a mechanical stirrer and was degassed by bubbling with nitrogen for 20 min. Subsequently the solvent in the reaction flask was brought to a temperature of 80° C. V601 (dimethyl-2,2-azodiisobutyrate) (2.359 g) was dissolved in 8 g of PGMEA and the initiator solution was degassed by bubbling with nitrogen for 20 min. The initiator solution was added into the reaction flask and then monomer solution was fed into the reactor dropwise over the 3 hour period under rigorous stirring and nitrogen environment. After monomer feeding was complete, the polymerization mixture was left standing for one additional hour at 80° C. After a total of 4 hours of polymerization time (3 hours of feeding and 1 hour of post-feeding stirring), the polymerization mixture was allowed to cool down to room temperature. Precipitation was carried out MTBE (1694 g). The power precipitated was collected by filtration, air-dried overnight, re-dissolved in 120 g of THF, and re-precipitated into MTBE (1694 g). The final polymer was filtered, air-dried overnight and further dried under vacuum at 60° C. for 48 hours to give 33.058 g of poly(MCPMA/OTDA) (50/50) copolymer (MP-3) (Mw=13,109 and Mw/Mn=1.80).

Additive Polymers (AP) Synthesis

The following monomers were employed in the syntheses of additive polymers (AP) as described below:

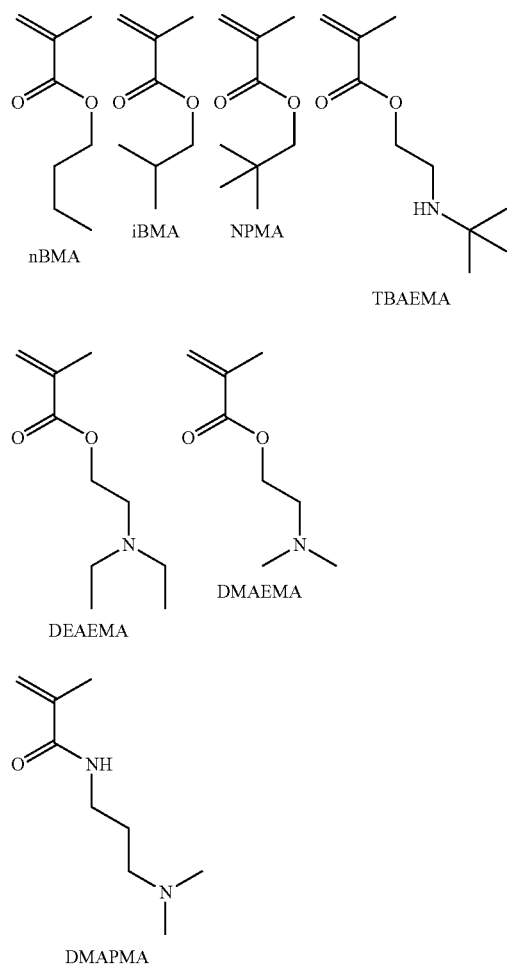

pKa values in water for the basic moiety-containing monomers are as follows: TBAEMA=8.99±0.1; DEAEMA=9.18±0.25; DMAEMA=8.18±0.28; and DMAPMA=9.39±0.28.

Example 4

Synthesis of Poly(iBMA/nBMA) (75/25) (AP-1)

30 g of iBMA and 10 g of nBMA monomers were dissolved in 60 g of PGMEA. The monomer solution was degassed by bubbling with nitrogen for 20 min. PGMEA (32.890 g) was charged into a 500 mL three-neck flask equipped with a condenser and a mechanical stirrer and was degassed by bubbling with nitrogen for 20 min. Subsequently the solvent in the reaction flask was brought to a temperature of 80° C. V601 (3.239 g) was dissolved in 8 g of PGMEA and the initiator solution was degassed by bubbling with nitrogen for 20 min. The initiator solution was added into the reaction flask and then monomer solution was fed into the reactor dropwise over the 3 hour period under rigorous stirring and nitrogen environment. After monomer feeding was complete, the polymerization mixture was left standing for one additional hour at 80° C. After a total of 4 hours of polymerization time (3 hours of feeding and 1 hour of post-feeding stirring), the polymerization mixture was allowed to cool down to room temperature. Precipitation was carried out in methanol/water (8/2) mixture (1730 g). The precipitated polymer was collected by filtration, air-dried overnight, re-dissolved in 120 g of THF, and re-precipitated into methanol/water (8/2) mixture (1730 g). The final polymer was filtered, air-dried overnight and further dried under vacuum at 25° C. for 48 hours to give 33.1 g of poly(iBMA/nBMA) (75/25) copolymer (AP-1) (Mw=9,203 and Mw/Mn=1.60).

Example 5

Synthesis of Poly(iBMA/TBAEMA) (95/5) (AP-2)

37.433 g of iBMA and 2.567 g of TBAEMA monomers were dissolved in 60 g of PGMEA. The monomer solution was degassed by bubbling with nitrogen for 20 min PGMEA (28.311 g) was charged into a 500 mL three-neck flask equipped with a condenser and a mechanical stirrer and was degassed by bubbling with nitrogen for 20 min. Subsequently the solvent in the reaction flask was brought to a temperature of 80° C. V601 (1.276 g) was dissolved in 8 g of PGMEA and the initiator solution was degassed by bubbling with nitrogen for 20 min. The initiator solution was added into the reaction flask and then monomer solution was fed into the reactor dropwise over the 3 hour period under rigorous stirring and nitrogen environment. After monomer feeding was complete, the polymerization mixture was left standing for one additional hour at 80° C. After a total of 4 hours of polymerization time (3 hours of feeding and 1 hour of post-feeding stirring), the polymerization mixture was allowed to cool down to room temperature. Precipitation was carried out in methanol/water (8/2) mixture (1651 g). The precipitated polymer was collected by filtration, air-dried overnight, re-dissolved in 120 g of THF, and re-precipitated into methanol/water (8/2) mixture (1651 g). The final polymer was filtered, air-dried overnight and further dried under vacuum at 25° C. for 48 hours to give 28.3 g of Poly(iBMA/TBAEMA) (95/5) copolymer (AP-2).

Additional Additive Polymers

Additional basic moiety-containing additive polymers were synthesized using the procedure set forth above. The results including those for AP-1 and AP-2 are summarized in Table 1.

TABLE 1

| Example | Additive Polymer | Monomer(s) | Polymer Comp'n* | Initiator** | Yield | Mw | Mw/Mn |
|---|---|---|---|---|---|---|---|
| 4 (Comp) | AP-1 | iBMA/nBMA | 75/25 | 5.0% | 77% | 9,203 | 1.60 |
| 5 | AP-2 | iBMA/TBAEMA | 95/5 | 2.0% | 71% | NA | NA |
| 6 | AP-3 | iBMA/DEAEMA | 95/5 | 2.0% | 69% | 14,414 | 2.19 |
| 7 (Comp) | AP-4 | NPMA | 100 | 2.0% | 77% | 18,156 | 1.73 |
| 8 | AP-5 | NPMA/TBAEMA | 95/5 | 2.0% | 75% | 17,460 | 1.87 |
| 9 | AP-6 | NPMA/DMAPMA | 95/5 | 2.0% | 77% | 9,760 | 1.51 |
| 10 | AP-7 | NPMA/DEAEMA | 95/5 | 2.0% | 80% | 18,158 | 1.88 |
| 11 | AP-8 | NPMA/DMAEMA | 95/5 | 2.0% | 76% | 6,650 | 1.09 |

*Molar feed ratio in the polymerization,
**Mole percent with respect to monomer,
NA = not available Characterization of Matrix Polymers (MP) and Additive Polymers (AP)

Matrix polymers and additive polymers were dissolved in PGMEA in an amount of 10 wt % based on solids and filtered through a Teflon filter having a 0.2 micron pore size. The filtered solutions were coated on 200 mm bare silicon wafers and were soft-baked at 120° C. for 60 seconds to give a film thickness of ~4000 Å. The use of additive polymers in the immersion lithography generally require a water receding contact angle higher than 70° to allow for a high scan speed of the exposure system without causing water mark defects.

Static contact angle (SCA), receding contact angle (RCA), advancing contact angle (ACA) and sliding angle (SA) with respect to DI water, diethylene glycol and diiodomethane were measured for each sample. Static and dynamic contact angles were measured using a KRUSS drop shape analyzer model 100. For dynamic contact angle measurement, the droplet size of DI water was 50 μl (microliter), and the wafer stage tilting rate was 1 unit/sec. Once a water droplet was placed on a test wafer surface, the wafer stage started to tilt immediately. During wafer stage tilting, video of the droplet was taken at a rate of 20 frames per second until the droplet slid away from its original location. Each frame in the video was then analyzed, and the image of the droplet on the frame when the droplet just started to slide was used to determine the dynamic contact angles (receding and advancing) by their corresponding tangent lines. Sliding angle is the wafer stage tilting angle corresponding to the frame when the droplet just started to slide. In static contact angle measurement, water droplet was 2.5 μl and placed on the test wafer surface without tilting. The contact angle was determined by the tangent lines on both sides of the droplet. The reported static contact angle was the average of the contact angles from left and right sides of the droplet. Surface energy was calculated based on the static contact angles of water, diiodomethane and diethylene glycol using the Extended Fowkes theory. The results are shown in Table 2.

TABLE 2

| Polymer | Angle Values | | | | Diethylene Glycol | Diiodo-methane | Surface Energy (mN/m) |
|---|---|---|---|---|---|---|---|
| | SCA | RCA | ACA | SA | | | |
| MP-1 | 71.7 | NA | NA | NA | 42.5 | 33.4 | 39 |
| MP-2 | 70.2 | NA | NA | NA | 44.2 | 33.6 | 38.9 |
| MP-3 | 70.5 | NA | NA | NA | 44.9 | 33.2 | 38.8 |
| AP-1 | 83.3 | 76.5 | 91.5 | 16.1 | 62.8 | 44.8 | 30.5 |
| AP-2 | 82.1 | 74.6 | 88.8 | 15.5 | 59.7 | 50 | 30.1 |
| AP-3 | 83.9 | 73.8 | 88.9 | 18.6 | 60.6 | 50 | 29.8 |
| AP-4 | 91.7 | 83.9 | 95.7 | 23.2 | 66.3 | 55.1 | 27.1 |
| AP-5 | 87.6 | 80.8 | 92.6 | 12.2 | 63.5 | 54.8 | 27.7 |
| AP-6 | 86.9 | 77.8 | 94.8 | 15 | 64.2 | 53.9 | 27.7 |
| AP-7 | 86.9 | 80.4 | 94.7 | 13.6 | 58.3 | 53.7 | 29.4 |
| AP-8 | 87.6 | 80.3 | 95.7 | 12.7 | 64.4 | 54.2 | 27.6 |

NA = Not measured.

Example 12 (Comparative)

Photoresist Composition 1 (PC-1)

PC-1 was prepared using Poly(iBMA/nBMA) (75/25) (AP-1) as an additive in the formulation. 1.063 g of PP-1 was dissolved in 19.360 g of PGMEA, and 19.360 g of methyl-2-hydroxyisobutyrate. To this mixture was added 0.179 g of "PAG A" described below, 0.012 g of 1-(tert-butoxycarbonyl)-4-hydroxypiperidine quencher and 0.026 g of AP1. The resulting mixture was rolled on a mechanical roller for three hours and then filtered through a Teflon filter having a 0.2 micron pore size.

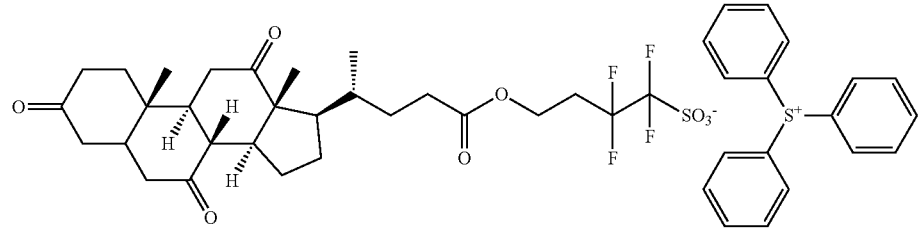

PAG A

Example 13

Photoresist Composition 2 (PC-2)

PC-2 was prepared using Poly(iBMA/TBAEMA) (95/5) (AP-2) as an additive in the formulation. 1.063 g of PP-1 was dissolved in 19.360 g of PGMEA, and 19.360 g of methyl-2-hydroxyisobutyrate. To this mixture was added 0.179 g of "PAG A" described above, 0.012 g of 1-(tert-butoxycarbonyl)-4-hydroxypiperidine quencher and 0.026 g of AP2. The resulting mixture was rolled on a mechanical roller for three hours and then filtered through a Teflon filter having a 0.2 micron pore size.

Example 14 (Comparative)

Photoresist Composition 3 (PC-3)

PC-3 was prepared using Poly(iBMA/nBMA) (75/25) (AP-1) as an additive in the formulation. 1.063 g of PP-2 was dissolved in 19.360 g of PGMEA, and 19.360 g of methyl-2-hydroxyisobutyrate. To this mixture was added 0.179 g of "PAG A" described above, 0.012 g of 1-(tert-butoxycarbonyl)-4-hydroxypiperidine quencher and 0.026 g of AP1. The resulting mixture was rolled on a mechanical roller for three hours and then filtered through a Teflon filter having a 0.2 micron pore size.

Example 15

Photoresist Composition 4 (PC-4)

PC-4 was prepared using Poly(iBMA/TBAEMA) (95/5) (AP-2) as an additive in the formulation. 1.063 g of PP-2 was dissolved in 19.360 g of PGMEA, and 19.360 g of methyl-2-hydroxyisobutyrate. To this mixture was added 0.179 g of "PAG A" described above, 0.012 g of 1-(tert-butoxycarbonyl)-4-hydroxypiperidine quencher and 0.026 g of AP2. The resulting mixture was rolled on a mechanical roller for three hours and then filtered through a Teflon filter having a 0.2 micron pore size.

Example 16 (Comparative)

Photoresist Composition 5 (PC-5)

PC-5 was prepared using Poly(iBMA/nBMA) (75/25) (AP-1) as an additive in the formulation. 1.063 g of PP-3 was dissolved in 19.360 g of PGMEA, and 19.360 g of methyl-2-hydroxyisobutyrate. To this mixture was added 0.179 g of "PAG A" described above, 0.012 g of 1-(tert-butoxycarbonyl)-4-hydroxypiperidine quencher and 0.026 g of AP1. The resulting mixture was rolled on a mechanical roller for three hours and then filtered through a Teflon filter having a 0.2 micron pore size.

Example 17

Photoresist Composition 6 (PC-6)

PC-6 was prepared using Poly(iBMA/TBAEMA) (95/5) (AP-2) as an additive in the formulation. 1.063 g of PP-3 was dissolved in 19.360 g of PGMEA, and 19.360 g of methyl-2-hydroxyisobutyrate. To this mixture was added 0.179 g of "PAG A" described above, 0.012 g of 1-(tert-butoxycarbonyl)-4-hydroxypiperidine quencher and 0.026 g of AP2. The resulting mixture was rolled on a mechanical roller for three hours and then filtered through a Teflon filter having a 0.2 micron pore size.

Examples 18-23

Lithographic Processing 300 mm silicon wafers were spin-coated with AR™ 40A antireflectant (Rohm and Haas Electronic Materials) to form a first BARC layer on a TEL CLEAN TRAC LITHIUS i+ coater/developer. The wafer was baked for 60 seconds at 215° C., yielding a first BARC film with a thickness of 840 Å. A second BARC layer was next coated over the first BARC using AR™ 124 antireflectant (Rohm and Haas Electronic Materials), and was baked at 205° C. for 60 seconds to generate a 200 Å top BARC layer. Photoresist compositions were then coated on the dual BARC-coated wafers and soft-baked at 90° C. for 60 seconds on a TEL CLEAN TRACK LITHIUS i+ coater/developer to provide a resist layer with a thickness of ~900 Å.

Wafers were exposed through a mask on an ASML TWIN-SCAN XT:1900i immersion scanner using an annular illumination condition with 1.35 NA, 0.9 outer sigma and 0.7 inner sigma. The exposed wafers were post-exposure baked at 90° C. for 60 seconds and then developed using n-butyl acetate (NBA) developer for 25 seconds on a TEL CLEAN TRACK™ LITHIUS™ i+ coater/developer to give negative tone patterns. Optimum energy ($E_{op}$) to print 45 nm holes was determined for the single exposure NTD process by plotting CD values, measured on a Hitachi CG4000 CD SEM, as a function of exposure energy using a mask CD at 60 nm (the diameter of an opaque post on the mask) and a pitch CD at 90 nm (a mask CD plus the distance between opaque posts). Exposure latitude (EL) of the photoresist was determined. EL is defined by the CD change (ΔCD) per exposure energy (mJ/cm$^2$) within ±10% of a target CD (CD) according to the following formula:

$$EL = (1.1 \times CD_t - 0.9 \times CD_t)/(Eop \text{ of } 1.1 \times CD_t - Eop \text{ of } 0.9 \times CD_t).$$

Local CD uniformity (CDU) of 45 nm holes was measured as a 3σ of 240 CD values. For each wafer, 20 images were taken per die and 12 contact hole measurements per image were taken at 250K magnification. The results are shown in Table 3.

TABLE 3

| Example | Photoresist Composition | Eop (mJ/cm$^2$) | EL (%) | CDU/Range | Missing Contact Holes |
|---|---|---|---|---|---|
| 18 (Comp) | PC-1 | 54.7 | 14.79 | 6.73/13.6 | Yes |
| 19 | PC-2 | 53.2 | 12.32 | 6.31/12.5 | No |
| 20 (Comp) | PC-3 | 56.1 | 15.10 | 7.74/12.3 | Yes |
| 21 | PC-4 | 55.8 | 14.88 | 7.64/16.8 | No |
| 22 (Comp) | PC-5 | 36.8 | 13.02 | 9.67/22.5 | Yes |
| 23 | PC-6 | 36.0 | 9.82 | 7.40/17.7 | No |

As observed in Table 3, when basic moiety-containing additive polymers were incorporated into the photoresist formulations, the presence of missing (closed) contact holes was not observed whereas their occurrence was observed for the comparative compositions not using basic moiety-containing additive polymers. It is believed that the basic moiety of the additive polymer can effectively neutralize excessive acid diffusion in the surface region of resist layer that could otherwise lead to missing contact holes. In addition, the photoresist compositions containing the basic moiety-containing additive polymers exhibited a decrease in $E_{op}$ and improved CDU.

Examples 24-32

Lithographic processing is conducted as described above in Examples 18-23 except using photoresist compositions described in Table 4. For these examples, the following additional matrix polymers and PAGs are used.

MP-4

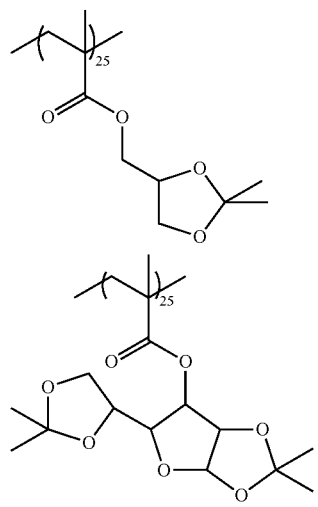

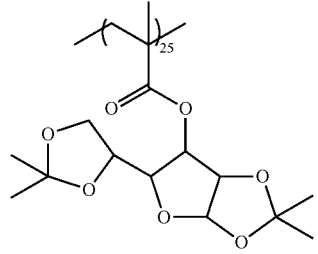

MP-5

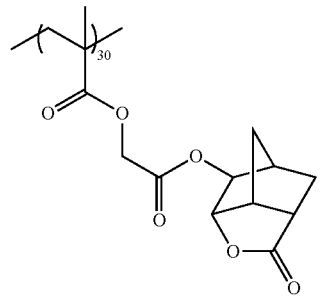

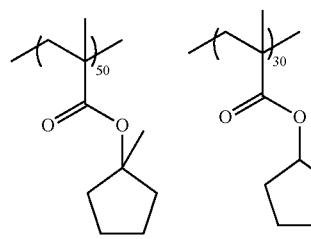

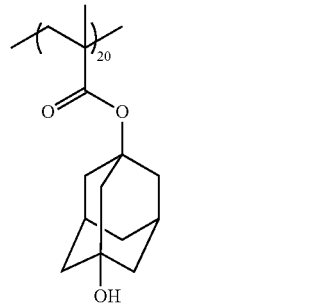

MP-6

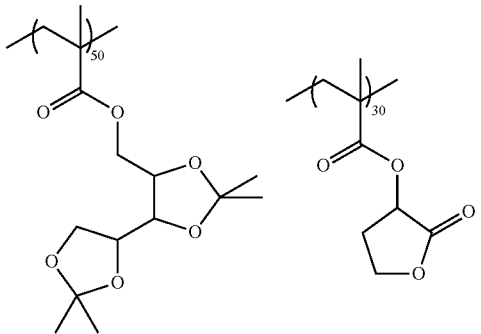

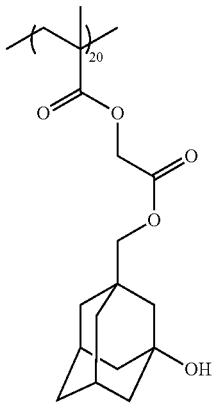

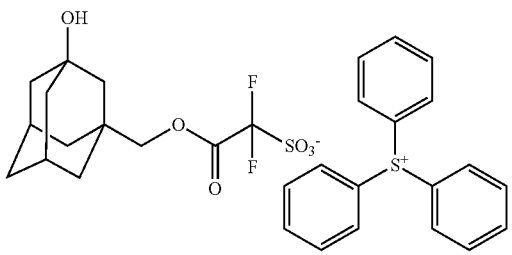

PAG C

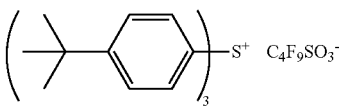

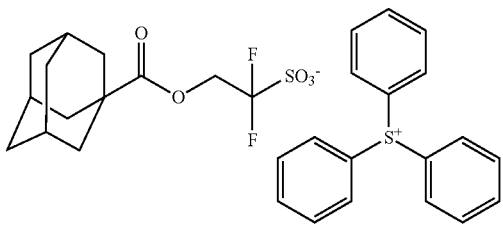

TABLE 4

| Example | Matrix Polymer | Additive Polymer | PAG | Solvent | Quencher |
|---|---|---|---|---|---|
| 24 | MP-4 | AP-5 | B | PGMEA/GBL (90/10) | DDEA |
| 25 | MP-4 | AP-6 | C | PGMEA/GBL (90/10) | DDEA |
| 26 | MP-4 | AP-7 | D | PGMEA/CHO/HBM (50/20/30) | tBOC-4HP |
| 27 | MP-5 | AP-5 | B | PGMEA/CHO/HBM (50/20/30) | tBOC-4HP |
| 28 | MP-5 | AP-6 | C | PGMEA/HBM (50/50) | DDEA |
| 29 | MP-5 | AP-7 | D | PGMEA/GVL (90/10) | DDEA |
| 30 | MP-6 | AP-5 | B | PGMEA/HBM (50/50) | DDEA |
| 31 | MP-6 | AP-6 | C | PGMEA/HBM (50/50) | tBOC-4HP |
| 32 | MP-6 | AP-7 | D | PGMEA/CHO/HBM (50/20/30) | DDEA |

PGMEA = propylene glycol monomethyl ether acetate;
GBL = gamma butyrolactone;
CHO = cyclohexanone;
HBM = 2-Hydroxyisobutyric acid methyl ester;
DDEA = dodecyldiethanol amine;
tBOC-4HP = 1-(tert-butoxycarbonyl)-4-hydroxypiperidine.

What is claimed is:

1. A photoresist composition, comprising:

a first polymer comprising an acid labile group;

a second polymer comprising:

a first unit formed from a first monomer having the following general formula (I):

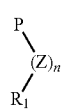
(I)

wherein: P is a polymerizable functional group; $R_1$ is chosen from substituted and unsubstituted C1 to C20 linear, branched and cyclic hydrocarbons; Z is a spacer unit chosen from substituted and unsubstituted linear or branched aliphatic and aromatic hydrocarbons, and combinations thereof, optionally with one or more linking moiety chosen from —O—, —S— and —COO—; and n is an integer from 0 to 5; and a second unit formed from a second monomer having a basic moiety, wherein the first monomer and the second monomer are different, and wherein the second monomer comprises a polymerizable group chosen from (alkyl)acrylate, vinyl, allyl and maleimide, and the basic moiety is chosen from amides;

wherein the second polymer is free of fluorine and acid-labile groups and wherein the second polymer has a surface energy lower than a surface energy of the first polymer;

a photoacid generator; and a solvent.

2. The photoresist composition of claim 1, wherein the first unit is formed from a monomer having the following general formula (I-1):

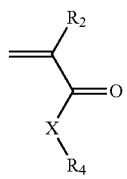
(I-1)

wherein: $R_2$ is chosen from hydrogen and C1 to C3 alkyl; $R_4$ is chosen from C1 to C15 alkyl; and X is oxygen or sulfur.

3. The photoresist composition of claim 2, wherein $R_4$ is chosen from C3 to C8 alkyl.

4. The photoresist composition of claim 1, wherein the second monomer is chosen from one or more of the following monomers:

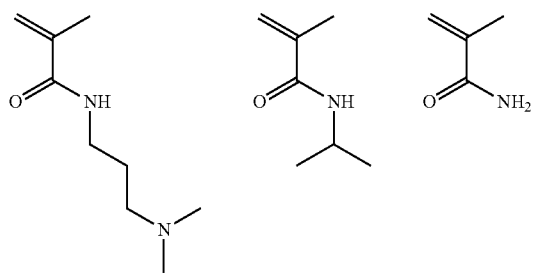

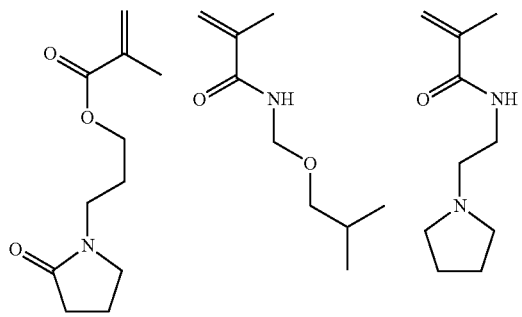

43

-continued

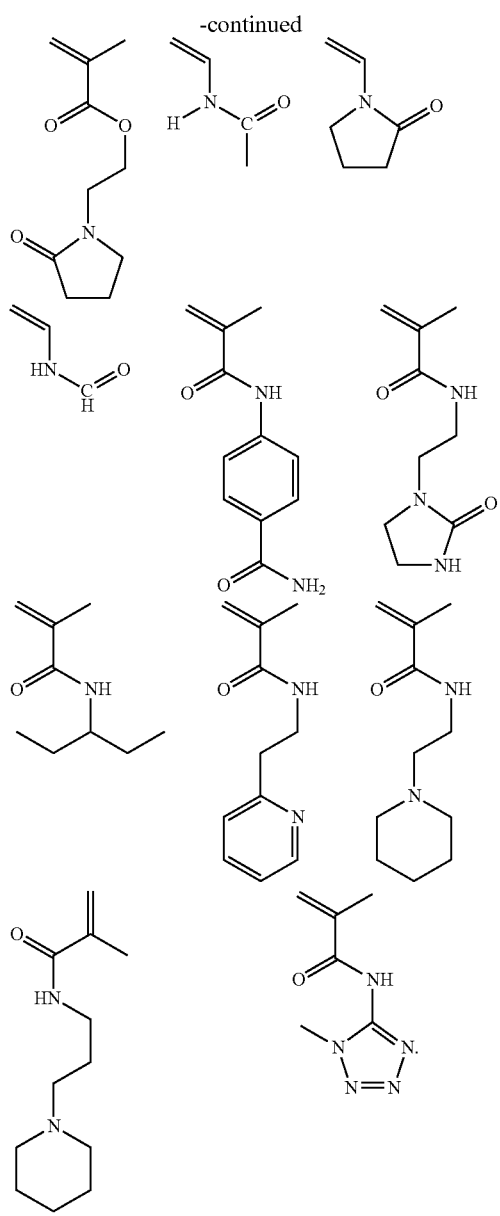

5. A coated substrate, comprising a substrate and a layer of a photoresist composition of claim 1 over a surface of the substrate.

6. A method of forming a photolithographic pattern by negative tone development, comprising:
(a) providing a substrate comprising one or more layer to be patterned over a surface of the substrate;
(b) applying a layer of a photoresist composition of claim 1 over the one or more layer to be patterned;
(c) patternwise exposing the photoresist composition layer to actinic radiation;
(d) heating the exposed photoresist composition layer in a post-exposure bake process; and
(e) applying a developer comprising an organic solvent to the photoresist composition layer, wherein unexposed portions of the photoresist layer are removed by the developer, leaving a photoresist pattern over the one or more layer to be patterned.

7. The method of claim 6, wherein the patternwise exposing is conducted by immersion lithography.

44

8. A photoresist composition, comprising:
a first polymer comprising an acid labile group;
a second polymer comprising:
a first unit formed from a first monomer having the following general formula (I):

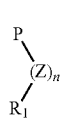

(I)

wherein: P is a polymerizable functional group; $R_1$ is chosen from substituted and unsubstituted C1 to C20 linear, branched and cyclic hydrocarbons; Z is a spacer unit chosen from substituted and unsubstituted linear or branched aliphatic and aromatic hydrocarbons, and combinations thereof, optionally with one or more linking moiety chosen from —O—, —S— and —COO—; and n is an integer from 0 to 5; and
a second unit formed from a monomer chosen from one or more of the following monomers:

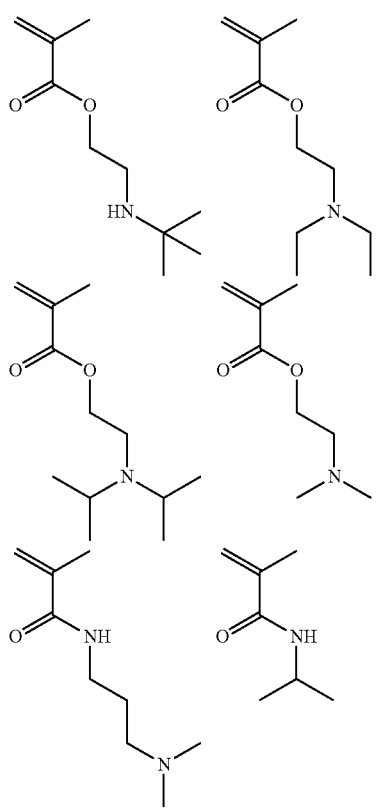

wherein the first monomer and the second monomer are different;
wherein the second polymer is free of fluorine and acid-labile groups and wherein the second polymer has a surface energy lower than a surface energy of the first polymer;
a photoacid generator; and
a solvent.

9. A method of forming a photolithographic pattern by negative tone development, comprising:

(a) providing a substrate comprising one or more layer to be patterned over a surface of the substrate;
(b) applying a layer of a photoresist composition of claim 8 over the one or more layer to be patterned;
(c) patternwise exposing the photoresist composition layer to actinic radiation;
(d) heating the exposed photoresist composition layer in a post-exposure bake process; and
(e) applying a developer comprising an organic solvent to the photoresist composition layer, wherein unexposed portions of the photoresist layer are removed by the developer, leaving a photoresist pattern over the one or more layer to be patterned.

10. The method of claim 9, wherein the patternwise exposing is conducted by immersion lithography.

11. A photoresist composition, comprising:
a first polymer comprising an acid labile group;
a second polymer comprising:
  a first unit formed from a first monomer having the following general formula (I):

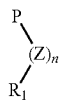
(I)

wherein: P is a polymerizable functional group; $R_1$ is chosen from substituted and unsubstituted C1 to C20 linear, branched and cyclic hydrocarbons; Z is a spacer unit chosen from substituted and unsubstituted linear or branched aliphatic and aromatic hydrocarbons, and combinations thereof, optionally with one or more linking moiety chosen from —O—, —S— and —COO—; and n is an integer from 0 to 5; and
  a second unit formed from a second monomer having a basic moiety, wherein the first monomer and the second monomer are different, and wherein the second monomer comprises a polymerizable group chosen from (alkyl)acrylate, vinyl, allyl and maleimide, and the basic moiety is chosen from amides;
wherein the second polymer is insoluble in alkaline developer, is free of acid-labile groups, and has a surface energy lower than a surface energy of the first polymer;
a photoacid generator; and
a solvent.

12. The photoresist composition of claim 11, wherein the first unit is formed from a monomer having the following general formula (I-1):

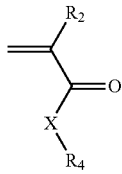
(I-1)

wherein: $R_2$ is chosen from hydrogen, fluorine and fluorinated and non-fluorinated C1 to C3 alkyl; $R_4$ is chosen from fluorinated and non-fluorinated C1 to C15 alkyl; and X is oxygen or sulfur.

13. The photoresist composition of claim 12, wherein $R_4$ is chosen from fluorinated and non-fluorinated C3 to C8 alkyl.

14. The photoresist composition of claim 11, wherein the second monomer is chosen from one or more of the following monomers:

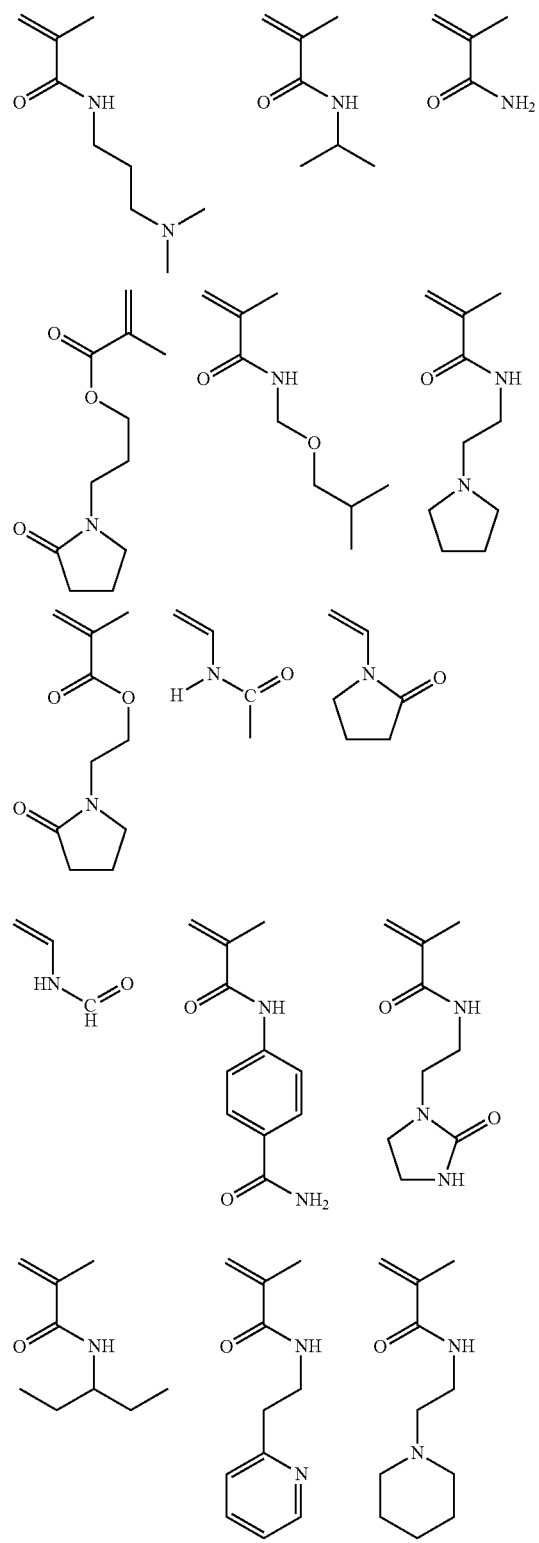

-continued
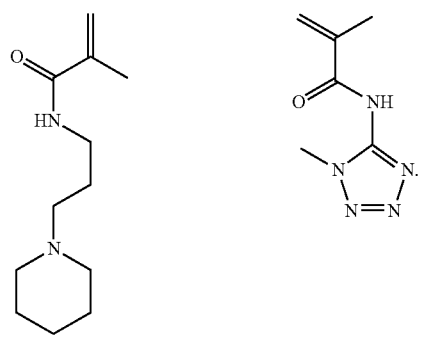
15. The photoresist composition of claim 14, wherein the basic moiety-containing unit is formed from a monomer chosen from one or more of the following monomers:
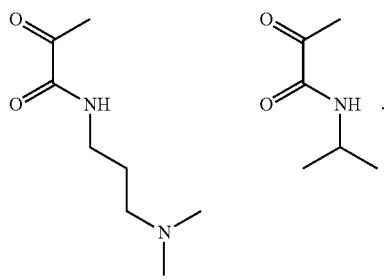
16. The photoresist composition of claim 11, wherein the first monomer of general formula (I) is chosen from one or more of the following monomers:
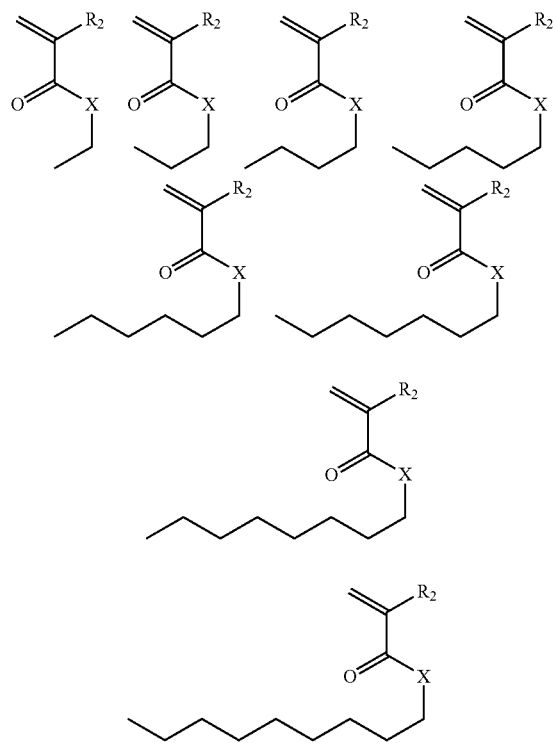
-continued
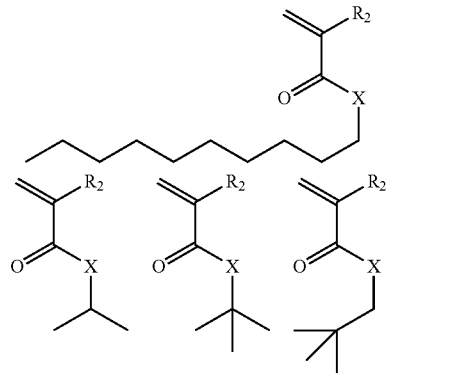
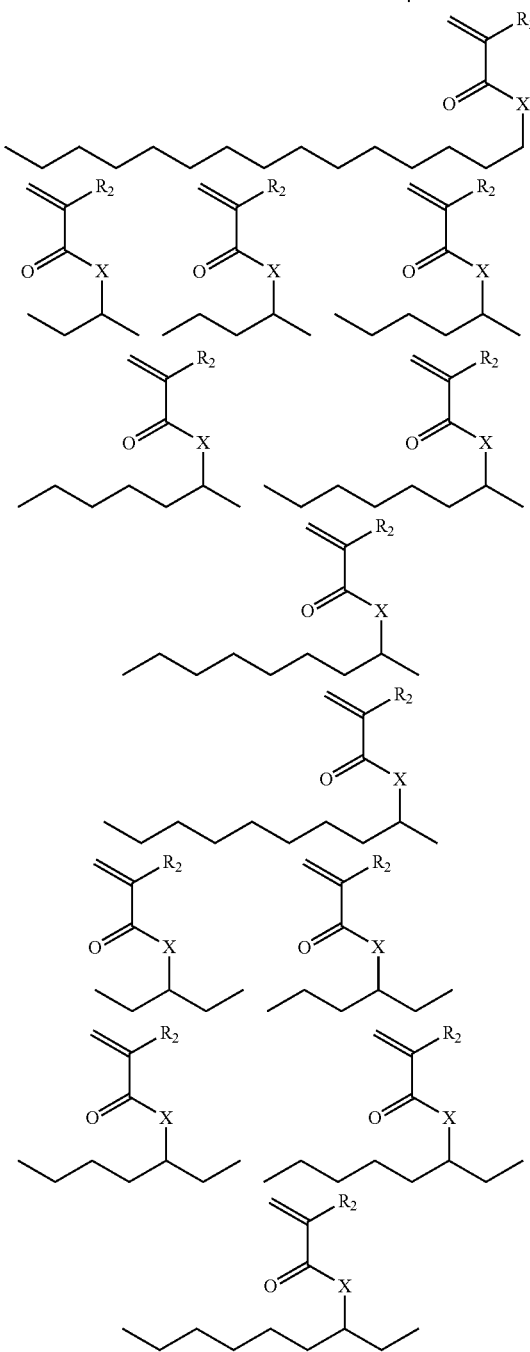

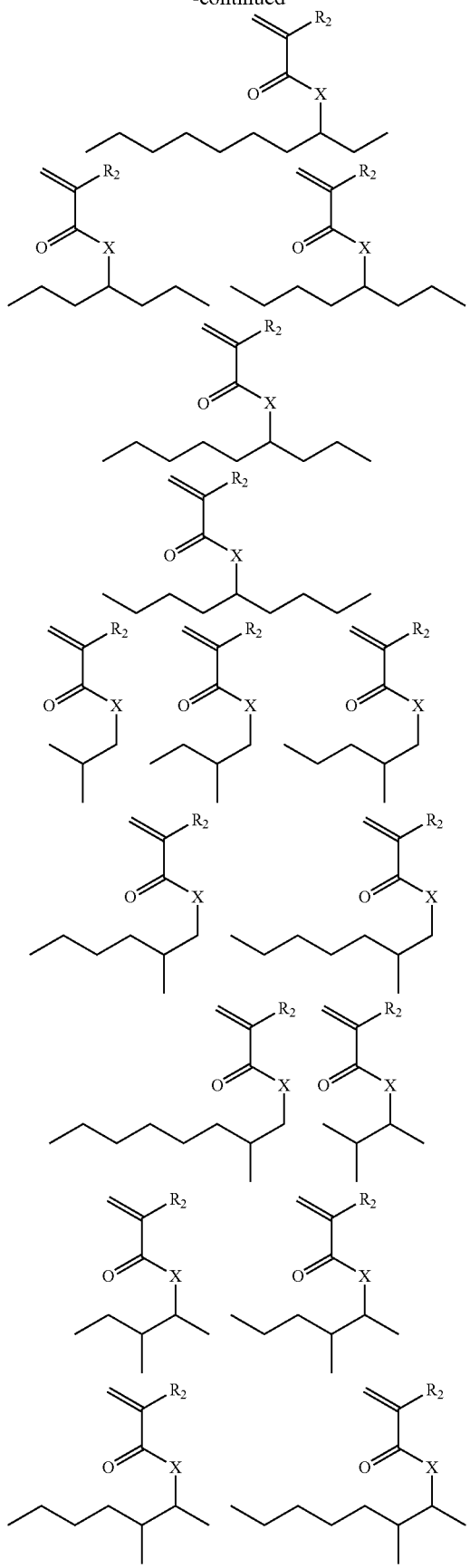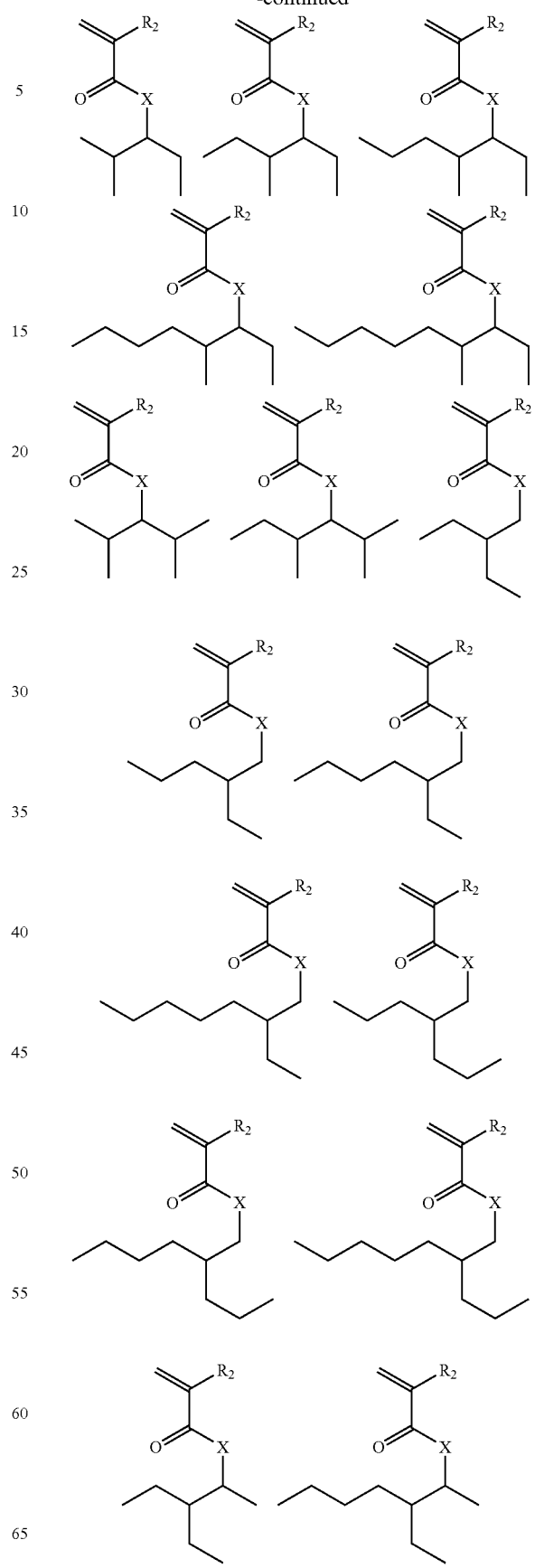

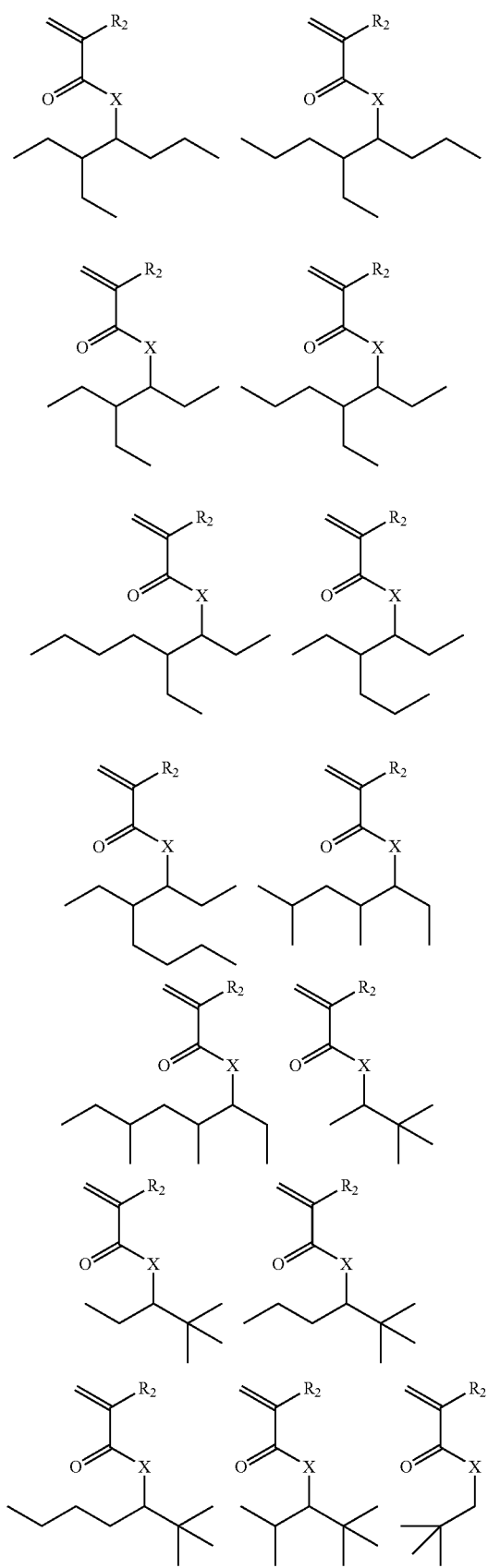
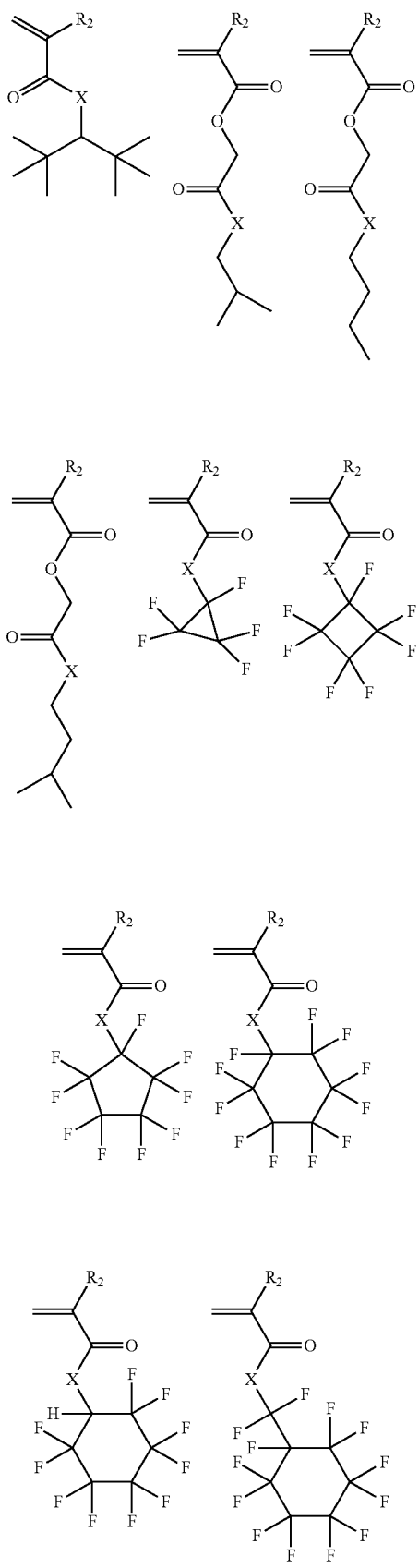

53
-continued

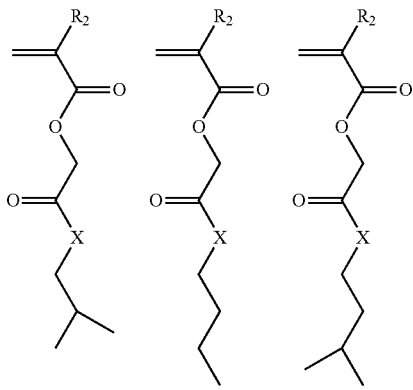

54
-continued

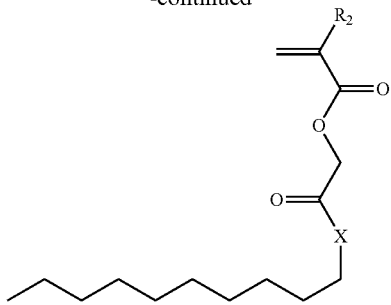

wherein $R_2$ is chosen from hydrogen, fluorine and fluorinated and non-fluorinated C1 to C3 alkyl; and X is oxygen or sulfur.

17. A method of forming a photolithographic pattern by negative tone development, comprising:
   (a) providing a substrate comprising one or more layer to be patterned over a surface of the substrate;
   (b) applying a layer of a photoresist composition of claim 11 over the one or more layer to be patterned;
   (c) patternwise exposing the photoresist composition layer to actinic radiation;
   (d) heating the exposed photoresist composition layer in a post-exposure bake process; and
   (e) applying a developer comprising an organic solvent to the photoresist composition layer, wherein unexposed portions of the photoresist layer are removed by the developer, leaving a photoresist pattern over the one or more layer to be patterned.

18. The method of claim 17, wherein the patternwise exposing is conducted by immersion lithography.

* * * * *